US012581797B2

(12) United States Patent
Kim et al.

(10) Patent No.: US 12,581,797 B2
(45) Date of Patent: Mar. 17, 2026

(54) ELECTRONIC DEVICE COMPRISING TRANSPARENT COVER INCLUDING GLASS AND FOLDABLE DISPLAY COUPLED THERETO

(71) Applicant: SAMSUNG ELECTRONICS CO., LTD., Suwon-si (KR)

(72) Inventors: Wooktae Kim, Suwon-si (KR); Ingi Kim, Suwon-si (KR); Wonho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 680 days.

(21) Appl. No.: 17/971,460

(22) Filed: Oct. 21, 2022

(65) Prior Publication Data

US 2023/0042280 A1     Feb. 9, 2023

Related U.S. Application Data

(63) Continuation of application No. PCT/KR2021/004985, filed on Apr. 21, 2021.

(30) Foreign Application Priority Data

Apr. 22, 2020     (KR) ........................ 10-2020-0048737

(51) Int. Cl.
*H10K 50/84* (2023.01)
*B32B 3/30* (2006.01)
(Continued)

(52) U.S. Cl.
CPC ............. *H10K 50/841* (2023.02); *B32B 3/30* (2013.01); *B32B 17/06* (2013.01); *B32B 17/063* (2013.01);
(Continued)

(58) Field of Classification Search
CPC .... H10K 50/841; H10K 59/40; H10K 77/111; H10K 2102/311; B32B 3/30;
(Continued)

(56) References Cited

U.S. PATENT DOCUMENTS 9,189,027 B2     11/2015   Lee et al.
9,645,613 B2      5/2017   Nam et al.
(Continued)

FOREIGN PATENT DOCUMENTS

CN     103294124     9/2013
CN     107067975     8/2017
(Continued)

OTHER PUBLICATIONS

Extended Search Report dated Aug. 3, 2023 in counterpart European Patent Application No. 21792418.2.
(Continued)

*Primary Examiner* — Yara B Green
*Assistant Examiner* — Akhee Sarker-Nag
(74) *Attorney, Agent, or Firm* — Nixon & Vanderhye, P.C.

(57) ABSTRACT

An example electronic device includes a transparent cover; and a flexible display coupled to the cover. The cover may include a first layer including glass; a second layer positioned between the first layer and the flexible display; and a third layer positioned between the first layer and the second layer. The third layer includes a pattern overlapping a folding part of the flexible display and including a plurality of grooves formed in a bonding surface with the second layer, and has a hardness greater than that of the second layer.

10 Claims, 11 Drawing Sheets

(51) Int. Cl.

| | |
|---|---|
| *B32B 17/06* | (2006.01) |
| *B32B 17/10* | (2006.01) |
| *B32B 25/20* | (2006.01) |
| *B32B 27/30* | (2006.01) |
| *B32B 27/40* | (2006.01) |
| *H10K 59/40* | (2023.01) |
| *H10K 77/10* | (2023.01) |
| *H10K 102/00* | (2023.01) |

(52) U.S. Cl.
CPC .............. *B32B 17/10* (2013.01); *B32B 25/20* (2013.01); *B32B 27/308* (2013.01); *B32B 27/40* (2013.01); *H10K 59/40* (2023.02); *H10K 77/111* (2023.02); *B32B 2307/412* (2013.01); *B32B 2307/418* (2013.01); *B32B 2307/536* (2013.01); *B32B 2307/732* (2013.01); *B32B 2457/20* (2013.01); *H10K 2102/311* (2023.02)

(58) Field of Classification Search
CPC ......... B32B 17/06; B32B 17/10; B32B 25/20; B32B 27/308; B32B 27/40; B32B 2307/732; B32B 2457/20; B32B 7/023; B32B 27/08; B32B 27/283; B32B 3/06; G06F 1/1637; G06F 1/1641; G06F 1/1643; G09F 9/301
See application file for complete search history.

(56) References Cited

U.S. PATENT DOCUMENTS

| | | | |
|---|---|---|---|
| 10,008,695 | B2 | 6/2018 | Park et al. |
| 10,037,054 | B2 | 7/2018 | Corbin et al. |
| 10,216,230 | B2 | 2/2019 | Kim et al. |
| 10,295,818 | B2 | 5/2019 | Nam et al. |
| 10,416,721 | B2 | 9/2019 | Shin et al. |
| 10,522,060 | B2 | 12/2019 | Park et al. |
| 10,545,537 | B2 | 1/2020 | Ahn et al. |
| 10,722,995 | B2 | 7/2020 | Park et al. |
| 11,528,822 | B2 | 12/2022 | Zhang et al. |

| | | | | |
|---|---|---|---|---|
| 2015/0236280 | A1* | 8/2015 | Sakuishi | ................. B32B 37/10 |
| | | | | 156/247 |
| 2016/0014881 | A1* | 1/2016 | Shin | ....................... G06F 1/1616 |
| | | | | 361/749 |
| 2017/0155084 | A1* | 6/2017 | Park | ........................ H10K 59/40 |
| 2017/0187856 | A1 | 6/2017 | Kim et al. | |
| 2017/0239771 | A1 | 8/2017 | Park et al. | |
| 2018/0046220 | A1* | 2/2018 | Kim | ..................... H10K 77/111 |
| 2018/0184529 | A1* | 6/2018 | Kim | ..................... B32B 27/281 |
| 2020/0176536 | A1 | 6/2020 | Cao et al. | |

FOREIGN PATENT DOCUMENTS

| | | |
|---|---|---|
| CN | 107721154 | 2/2018 |
| CN | 108493213 | 9/2018 |
| CN | 108962028 | 12/2018 |
| KR | 10-2012-0021070 | 3/2012 |
| KR | 10-2017-0023231 | 3/2017 |
| KR | 10-2017-0100104 | 9/2017 |
| KR | 10-2017-0122554 | 11/2017 |
| KR | 10-2018-0018925 | 2/2018 |
| KR | 10-2018-0036304 | 4/2018 |
| KR | 10-2018-0079093 | 7/2018 |
| KR | 10-2019-0075715 | 7/2019 |
| KR | 10-2040299 | 11/2019 |
| WO | 2020/010888 | 1/2020 |

OTHER PUBLICATIONS

International Search Report for PCT/KR2021/004985 mailed Jul. 27, 2021, 4 pages.
Written Opinion of the ISA for PCT/KR2021/004985 mailed Jul. 27, 2021, 4 pages.
Office Action dated Jan. 26, 2025 in Chinese Patent Application No. 202180030687.1 and English-language translation.
Communication pursuant to Article 94(3) EPC dated Jun. 3, 2025 in European Application No. 21792418.2.
Office Action dated Jun. 9, 2025 in Chinese Application No. 202180030687.1 and English-language translation.
Office Action dated Jul. 3, 2025 in Korean Application No. 10-2020-0048737 and English-language translation.
Notification of Grant dated Sep. 30, 2025 in Chinese Patent Application No. 202180030687.1 and English-language translation.

\* cited by examiner

ELECTRONIC DEVICE COMPRISING TRANSPARENT COVER INCLUDING GLASS AND FOLDABLE DISPLAY COUPLED THERETO

CROSS-REFERENCE TO RELATED APPLICATIONS

This application is a continuation application of International Application No. PCT/KR2021/004985 designating the United States, filed on Apr. 21, 2021, in the Korean Intellectual Property Receiving Office and claiming priority to Korean Patent Application No. 10-2020-0048737, filed on Apr. 22, 2020, in the Korean Intellectual Property Office, the disclosures of which are incorporated by reference herein in their entireties.

BACKGROUND

1. Field

The disclosure relates to an electronic device including a transparent cover including glass and a foldable display coupled thereto.

2. Description of Related Art

With the development of digital technology, various types of electronic devices, such as smartphones, tablet personal computers (PCs), and personal digital assistants (PDAs), are being provided. Electronic devices are being designed to provide a larger screen while having a portable size to be comfortable in a user's hand. Electronic devices may be configured, for example, as a foldable type in which a screen is foldable or unfoldable.

SUMMARY

A foldable-type electronic device may include a foldable display and a transparent glass cover which is coupled to the foldable display and forms the exterior of the electronic device. The glass cover may have natural smoothness of glass or surface evenness. For the glass cover to have flexibility, the glass cover may be configured in the form of a thin film due to brittleness of glass. Thus, the glass cover has a risk of being damaged by an external impact or external pressure.

Various embodiments of the disclosure may provide an electronic device including a transparent cover including glass capable of preventing or reducing damage by an external impact or external pressure and a foldable display coupled thereto.

According to an embodiment of the disclosure, an electronic device may include a transparent cover and a flexible display coupled to the cover, wherein the cover may include a first layer including glass, a second layer positioned between the first layer and the flexible display, and a third layer positioned between the first layer and the second layer, and the third layer may include a pattern overlapping a folding part of the flexible display and including a plurality of grooves formed on a bonding surface with the second layer, and may have a hardness greater than that of the second layer.

An electronic device according to various embodiments of the disclosure may provide a fine appearance by using a transparent cover including glass, and may prevent or reduce the transparent cover from being damaged by an external impact or external pressure.

In addition, effects obtainable or predictable by various embodiments of the disclosure are to be disclosed explicitly or implicitly in the detailed description of the embodiments of the disclosure. For example, various effects predicted according to various embodiments of the disclosure will be disclosed in the detailed description to be described below.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
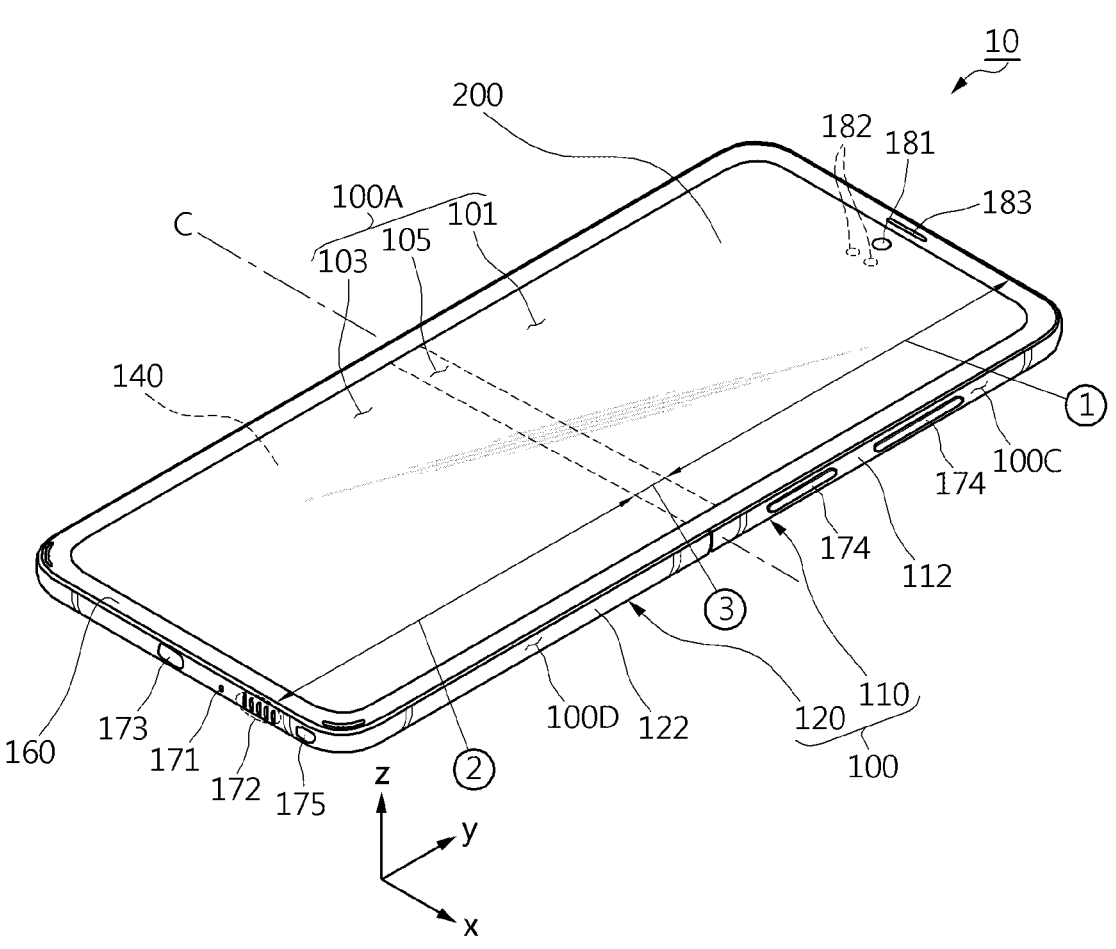
FIG. 1 is a perspective view of the front of an example electronic device when the example electronic device is in an unfolded state according to various embodiments.

Hereinafter, various embodiments of the disclosure will be described with reference to the accompanying drawings.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), the element may be coupled/connected with/to the other element directly (e.g., wiredly), wirelessly, or via a third element.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, a home appliance, or the like. The electronic device according to embodiments of the disclosure is not limited to the electronic devices described or mentioned above.

Figure 2:
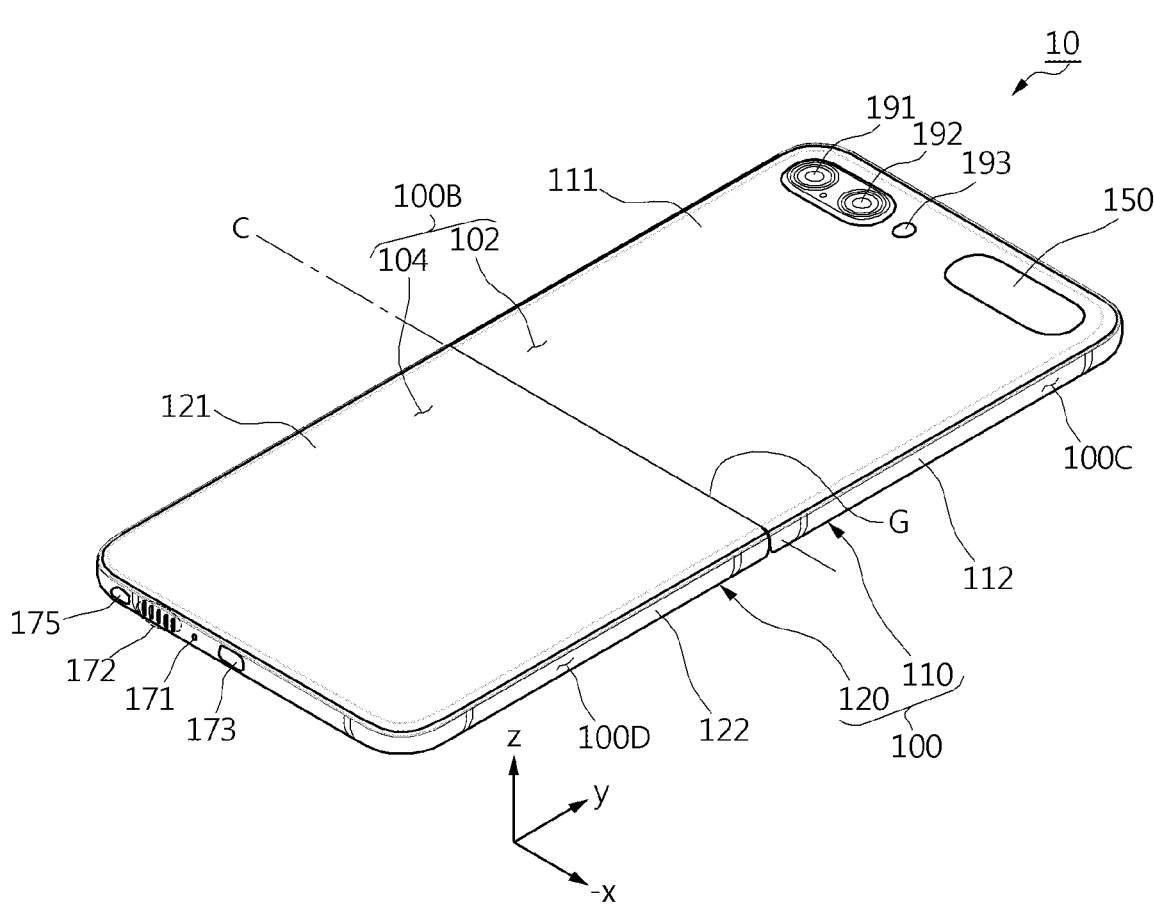
FIG. 2 is a perspective view of the rear of the example electronic device of FIG. 1 when the example electronic device is in the unfolded state according to various embodiments.
Figure 3:
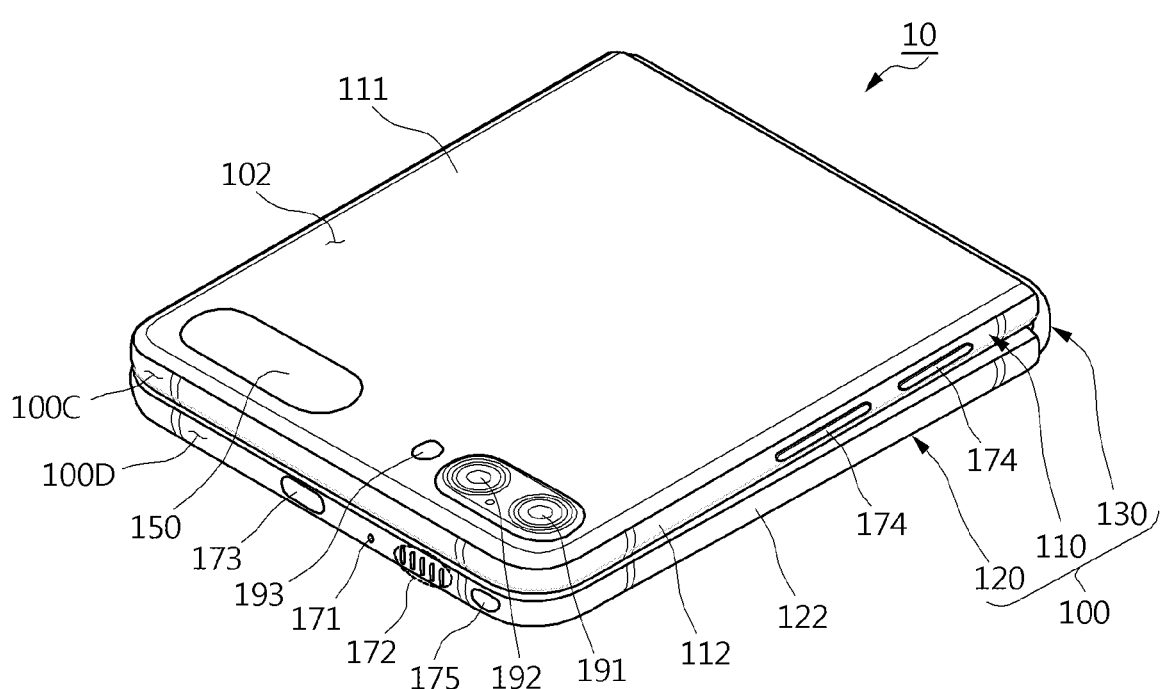
FIG. 3 is a perspective view of the example electronic device of FIG. 1 when the example electronic device is in a folded state according to various embodiments.

FIG. 1 is a perspective view of the front of an example electronic device 10 when the electronic device 10 is in a flat or unfolded state according to various embodiments. FIG. 2 is a perspective view of the rear of the example electronic device 10 of FIG. 1 when the example electronic device 10 is in the flat or unfolded state according to various embodiments. FIG. 3 is a perspective view of the example electronic device 10 of FIG. 1 when the example electronic device 10 is in a folded state according to various embodiments.

Referring to FIG. 1 and FIG. 2, the electronic device 10 may include a foldable housing 100 and a flexible display (or foldable display) 140 positioned in an inner space of the foldable housing 100. The foldable housing 100 may include a front surface 100A of the electronic device 10 facing the flexible display 140 and a rear surface 100B of the electronic device 10 positioned opposite to the front surface 100A. The foldable housing 100 may include a first lateral surface 100C and a second lateral surface 100D of the electronic device 10 which at least partially surround a space between the front surface 100A and the rear surface 100B. An image output from the flexible display 140 may be seen through the front surface 100A.

According to an embodiment, the foldable housing 100 may include a first housing unit (or a first housing or a first housing structure) 110 connected by a hinge (or a hinge assembly) (not shown) to a second housing unit (or a second housing or a second housing structure) 120. The first housing unit 110 and the second housing unit 120 may be rotatable with respect to a folding axis (e.g., a rotation axis of the hinge) C. The first housing unit 110 may include a first surface 101 of the electronic device 10 and a second surface 102 of the electronic device 10 which face in opposite directions. The second housing unit 110 may include a third surface 103 of the electronic device 10 and a fourth surface 104 of the electronic device 10 which face in opposite directions. The foldable housing 100 may be configured in an in-folding structure in which the front surface 100A is folded inward. For example, in the folded state of FIG. 3, the first surface 101 and the third surface 103 may face each other, and the front surface 100A may not be substantially visually exposed.

According to an embodiment, the foldable housing 100 may include a front cover (e.g., a window) 200 forming at least part of the front surface 100A, and the flexible display 140 may be protected from the outside by the front cover 200. Referring to FIG. 1, the front cover 200 may have a rectangular shape including both long edges and both short edges. The front cover 200 may include a first section ①, a second section ②, and a folding section (or bendable section) ③ between the first section ① and the second section ②. When the electronic device 10 is changed from the unfolded state of FIG. 1 to the folded state of FIG. 3, the folding section ③ may be bent. When the electronic device 10 is changed from the folded state of FIG. 3 to the unfolded state of FIG. 1, the folding section ③ may be unfolded. The first housing unit 110 may include the first section ①, and the first section ① may form the first surface 101. The second housing unit 120 may include the second section ②, and the second section ② may form the third surface 103. The first housing unit 110 may include part (not shown) of the folding section ③ positioned on one side with respect to the folding axis C. The second housing unit 120 may include part (not shown) of the folding section ③ positioned on the other side with respect to the folding axis C. The folding section ③ may form a fifth surface 105 between the first surface 101 and the third surface 103. The first surface 101, the third surface 103, and the fifth surface 105 may form the front surface 100A of the foldable housing 100.

According to an embodiment, the front cover 200 may include glass. The front cover 200 may have natural smoothness of glass or surface evenness. Unlike a plastic film (e.g., a polyimide film), the front cover 200 including the glass may, for example, provide a shining aesthetic sense when a screen is turned off. The front cover 200 including glass may have increased or a higher hardness than a plastic film and/or excellent resistance to scratches.

The flexible display 140 may extend, for example, from the first section ① to the second section ② across the folding section ③, and may be combined with the front cover 200. The flexible display 140 may include a first part (not shown) overlapping the first section ①, a second part (not shown) overlapping the second section ②, and/or a folding part (not shown) overlapping the folding section ③. Referring to FIG. 1, an active area of the flexible display 140 in which a plurality of pixels is disposed to express an image may be visually exposed through a considerable portion of the front cover 200. The screen is an area for displaying an image in the device including the flexible display 140 and the front cover 200, and may include the active area of the flexible display 140 and an area of the front cover 200 overlapping the active area. The screen may have a rectangular shape, and an edge of the screen may extend along the edges of the front cover 200.

According to an embodiment, the first housing unit 110 may include a first rear cover 111 forming at least part of the second surface 102 and a first lateral member (or a first lateral bezel structure) 112 forming at least part of the first lateral surface 100C. The first lateral member 112 may have a form which at least partially surrounds a space between the first rear cover 111 and the front cover 200. The second housing unit 110 may include a second rear cover 121 forming the fourth surface 104 and a second lateral member (or a second lateral bezel structure) 122 forming the second lateral surface 100D. The second lateral member 122 may have a form which at least partially surrounds a space between the second rear cover 121 and the front cover 200. The second surface 102 and the fourth surface 104 may form the rear surface 100B of the foldable housing 100. Referring to FIG. 3, in the folded state of the electronic device 10, the first lateral member 112 and the second lateral member 122 may be arranged to overlap each other. The first lateral member 112 and/or the second lateral member 122 may be formed, for example, using ceramic, a polymer, metal (e.g., aluminum, stainless steel, or magnesium), or a combination of at least two of the foregoing materials. The first lateral member 112 and/or the second lateral member 122 may include, for example, various metallic materials, such as titanium, an amorphous alloy, a metal-ceramic composite material (e.g., cermet), stainless steel, magnesium, a magnesium alloy, aluminum, an aluminum alloy, a zinc alloy, and/or a copper alloy.

According to an embodiment, the first rear cover 111 and/or the second rear cover 121 may be, for example, substantially opaque. The first rear cover 111 and/or the second rear cover 121 may be formed, for example, using coated or colored glass, ceramic, a polymer, metal (e.g., aluminum, stainless steel, or magnesium), or a combination of at least two of the foregoing materials. In an embodiment, the first rear cover 111 or the second rear cover 121 may include a plate of various types of materials, such as transparent glass, ceramic, and/or a polymer, and at least one coating layer disposed on the plate using coating. In another example, the first rear cover 111 or the second rear cover 121 may include a plate of various types of materials, such as transparent glass, ceramic, and/or a polymer, and a film (e.g., a decoration film) having various visual effects attached to the plate. In an embodiment, the first rear cover 111 and the first lateral member 112 may be formed as a single body, and may include the same material. In an embodiment, the second rear cover 121 and the second lateral member 122 may be formed as a single body, and may include the same material.

Referring to FIG. 1, in an embodiment, in the unfolded state of the electronic device 10, the first surface 101 and the third surface 103 may face substantially the same direction, and the fifth surface 105 may form the same plane as the first surface 101 and the third surface 103. For example, in the unfolded state of the electronic device 10, the first surface 101 and the third surface 103 may form an angle of about 180 degrees. Referring to FIG. 2, in the unfolded state of the electronic device 10, the second surface 102 and the fourth surface 104 may face substantially the same direction.

Referring to FIG. 3, in an embodiment, the folded state may include a fully folded state. The fully folded state is a state in which the first surface 101 and the third surface 103 are maximally folded to be close to each other, for example, in which the first surface 101 and the third surface 103 may face each other while forming a narrow angle (e.g., an angle of about 0 degrees to about 10 degrees). In the fully folded state, the front surface 100A may not be substantially exposed to the outside.

According to an embodiment, the unfolded state of the electronic device 10 may refer, for example, to a state other than the folded state of FIG. 3, and may include a fully unfolded state or an intermediate state. In the fully unfolded state, for example, as shown in FIG. 1, the first surface 101 and the third surface 103 may form an angle of about 180 degrees. The intermediate state (not shown) may refer to a state between the folded state and the fully unfolded state.

Referring to FIG. 3, in an embodiment, the foldable housing 100 may include a hinge cover (or hinge housing) 130. When changing from the unfolded state of FIG. 2 to the folded state of FIG. 3, the hinge cover 130 may cover the inside of the electronic device 10 along the folding axis C so as not to be exposed as a gap G between the first housing unit 110 and the second housing unit 120 is opened. As shown in FIG. 2, in the fully unfolded state of the electronic device 10, there may be substantially no gap G between the first housing unit 110 and the second housing unit 120, and the hinge cover 130 may be covered by the first housing unit 110 and the second housing unit 120 and may thus not be exposed. Although not shown, in the intermediate state, the hinge cover 130 may be partially exposed between the first housing unit 110 and the second housing unit 120. The hinge cover 130 may be more exposed in the folded state of FIG. 3 than in the intermediate state.

According to various embodiments (not shown), the foldable housing may refer to a structure forming at least some of the front surface 100A, the rear surface 100B, the first lateral surface 100C, and the second lateral surface 100D, and the structure may be configured in various forms. For example, the foldable housing may include the first housing unit, the second housing unit, and the folding unit connected to the first housing unit and the second housing unit. The folding unit may refer to a part more flexible than the first housing unit and the second housing unit, and may be bent in the folded state of the electronic device. The folding unit may be configured as, for example, a structure (e.g., a multi-bar structure, a hinge rail, or a hinge rail structure) in which a plurality of bars (or rails) extending in an x-axis direction is arranged from the first housing unit to the second housing unit. The folding part may be configured using various other structures which are bendable (or have a bending characteristic) while connecting the first housing unit and the second housing unit.

According to an embodiment, the electronic device 10 may further include a cover member 160 disposed on the front cover 200. The cover member 160 may be disposed, for example, in a screen-surrounding area of the front cover 200 along the edges of the front cover 200. The cover member 160 is, for example, a cushioning member, and may relieve impact between the first section ①️ and the second section ②️ of the front cover 200 to prevent (or reduce) the front cover 200 from being damaged when the electronic device 10 is changed from the flat state of FIG. 1 to the folded state of FIG. 3. A portion (not shown) of the cover member 160 positioned in the first housing unit 110 and a portion of the cover member 160 positioned in the second housing unit 120 may come in contact with each other in the folded state of FIG. 3, and the first section ①️ and the second section ②️ may be positioned substantially spaced apart without contact. The cover member 160 may also contribute to an aesthetic feature as a bezel surrounding the screen. According to various embodiments, the screen may be further expanded without being limited to the embodiment of FIG. 1, and accordingly the shape of the cover member 160 may be variously changed. In an embodiment, the screen may be expanded to substantially the entire area of the front cover 200, in which case the cover member 160 may be omitted.

According to an embodiment, the electronic device 10 may include at least one of a microphone hole 171, speaker holes 172 and 183, a sensor module 182, a first camera device 181, second camera devices 191 and 192, a flash 193, key input devices 174, a connector hole 173, a pen input device 175, or a sub-display 150. According to an embodiment, the electronic device 10 may omit at least one (e.g., a key input device 174) of the components, or may additionally include another component (e.g., a light emitting device).

The microphone hole 171 may be formed, for example, on the second lateral surface 100D corresponding to a microphone (not shown) positioned inside the electronic device 10. The position or number of microphone holes 171 may vary without being limited to the embodiment of FIG. 1. According to various embodiments, the electronic device 10 may include a plurality of microphones capable of detecting the direction of a sound.

A first speaker hole 172 may be formed, for example, on the second lateral surface 100D corresponding to a speaker (not shown) positioned inside the electronic device 10. The position of the speaker hole 172 may vary without being limited to the embodiment of FIG. 1. According to an embodiment, the microphone hole 171 and the speaker hole 172 may be configured as one hole, or the speaker hole 172 (e.g., for a piezo speaker). A second speaker hole 183 may be formed, for example, on the first surface 101 corresponding to a call receiver (not shown) positioned inside the electronic device 10. The cover member 160 may include a hole (not shown) formed to correspond to the second speaker hole 183.

The connector hole 173 may be formed, for example, on the second lateral surface 100D corresponding to a connector (e.g., a USB connector) positioned inside the electronic device 10. The electronic device 10 may transmit and/or receive power and/or data to and/or from an external electronic device electrically connected to the connector through the connector hole 173. The position of the connector hole 173 may vary without being limited to the embodiment of FIG. 1.

The first camera device 181 may be positioned, for example, near the first surface 101 inside the electronic device 10. According to an embodiment, the first camera device 181 may receive external light through a portion (not shown) of the front cover 200 and an opening (not shown) of the flexible display 140 aligned therewith. The opening of the flexible display 140 may include a through hole, but may be configured in the form of a notch without being limited thereto. According to various embodiments (not shown), a substantially transparent area formed by changing a pixel structure and/or a wiring structure may be configured instead of the opening of the flexible display 140. In this case, the first camera device 181 may be positioned on or adjacent to a rear surface of the flexible display 140.

The second camera devices 191 and 192 may be disposed, for example, in an opening (not shown) formed in the first rear cover 111. The flash 193 may be positioned, for example, near the second surface 102 inside the electronic device 10, and light output from the flash 193 may pass through a portion of a transparent area of the second surface 102 to proceed to the outside. The first camera device 181 or the second camera devices 191 and 192 may include one or a plurality of lenses, an image sensor, and/or an image signal processor. The flash 193 may include, for example, a light emitting diode or a xenon lamp.

The key input devices 174 may be disposed, for example, in an opening (not shown) formed on the first lateral surface 100C. In another embodiment, the electronic device 10 may not include some or all of the key input devices 174, and the key input devices not included may be configured in other forms, such as soft keys, on the flexible display 140. In an embodiment (not shown), the key input devices may include at least one sensor module.

The sensor module 182 may generate, for example, an electrical signal or a data value corresponding to an internal operating state of the electronic device 10 or an external environmental state. According to an embodiment, the sensor module 182 may include a proximity sensor which generates a signal relating to proximity of an external object, based on light received through the front surface 100A of the electronic device 10 placed in a direction which the screen faces. The flexible display 140 may include an opening formed to correspond to the sensor module 182, or a substantially transparent area formed by changing the pixel structure and/or wiring structure may be configured instead of the opening. In this case, the sensor module 182 may be positioned on or adjacent to the rear surface of the flexible display 140. In another example (not shown), the sensor module may include various biometric sensors, such as a fingerprint sensor and an HRM sensor, for detecting biometric information, based on light received through the front surface 100A or the rear surface 100B of the electronic device 10. The electronic device 10 may include at least one of various other sensor modules, for example, a gesture sensor, a gyro sensor, a barometric pressure sensor, a magnetic sensor, an acceleration sensor, a grip sensor, a color sensor, an infrared (IR) sensor, a biometric sensor, a temperature sensor, and a humidity sensor, or an illuminance sensor.

The pen input device 175 (e.g., a stylus pen) may be guided into the second housing 120 to be inserted or may be detached, for example, through a hole (not shown) formed in the second lateral surface 100D of the second housing unit 120. The pen input device 175 may be configured to be inserted or detachable at various other positions without being limited to the embodiment of FIG. 1. For example, the pen input device 175 may be attached to the front surface 100A, the rear surface 100B, the first lateral surface 100C, or the second lateral surface 100D through an attractive force using a magnetic material or various methods, such as a mechanical fastening structure. According to an embodiment, the pen input device 175 may be configured as an electromagnetic induction type (e.g., an electro-magnetic resonance (EMR) type). The pen input device 175 may include a resonance circuit, and may be linked with an electromagnetic induction panel (e.g., a digitizer) included in the electronic device 10. According to an embodiment, the flexible display 140 may be coupled to or disposed adjacent to the electromagnetic induction panel which detects the pen input device 175. According to various embodiments, the flexible display 140 may include an electromagnetic induction panel.

According to an embodiment, the pen input device 175 may be configured as the electro-magnetic resonance (EMR) type, an active electrical stylus (AES), or an electric coupled resonance (ECR) type. The electromagnetic induction panel may be omitted depending on a configuration type of the pen input device 175.

The sub-display 150 may be positioned, for example, adjacent to the first rear cover 111 inside the first housing unit 110. A portion (not shown) of the first rear cover 111 may overlap the sub-display 150, and may be substantially transparent. The electronic device 10 may output an image through the sub-display 150 instead of or in addition to the flexible display 140 in the folded state of FIG. 3.

According to an embodiment (not shown), the electronic device 10 may be configured as an out-folding structure in which a screen is folded outward.

Figure 4:
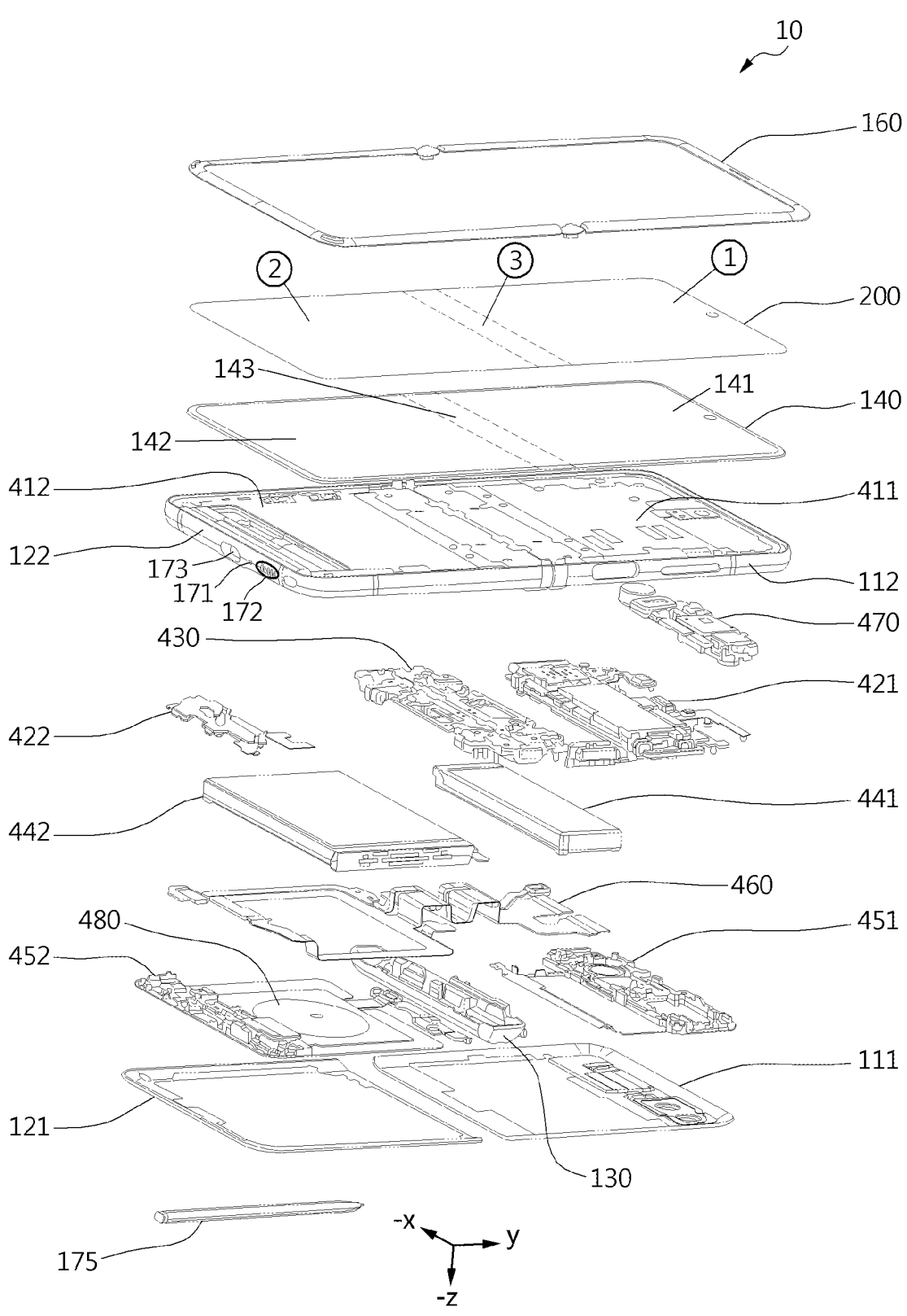
FIG. 4 is an exploded perspective view of the example electronic device of FIG. 1 according to various embodiments.

FIG. 4 is an exploded perspective view of the example electronic device 10 of FIG. 1 according to various embodiments.

Referring to FIG. 4, in an embodiment, the electronic device 10 may include the first lateral member 112, the second lateral member 122, a first support member 411, a second support member 412, a hinge 430, the front cover 200, the first rear cover 111, the second rear cover 121, the hinge cover 130, the cover member 160, the flexible display 140, a first substrate assembly 421, a second substrate assembly 422, a first battery 441, a second battery 442, a third support member 451, a fourth support member 452, a wiring member 460, a camera assembly 470, an antenna 480, or the pen input device 175. In an embodiment, the electronic device 10 may omit at least one of the components, or may additionally include another component. A redundant description of some of reference numerals of FIG. 4 is not repeated here.

The first support member (e.g., a first bracket) 411 may be, for example, disposed inside the first housing unit 110 of FIG. 1 and connected to the first lateral member 112, or formed with the first lateral member 112 as a single body. In an embodiment, the first support member 411 and the first lateral member 112 may be referred to as a first front case. The second support member (e.g., a second bracket) 412 may be, for example, disposed inside the second housing unit 120 of FIG. 1 and connected to the second lateral member 122, or formed with the second lateral member 122 as a single body. In an embodiment, the second support member 412 and the second lateral member 122 may be referred to as a second front case. The first support member 411 and/or the second support member 412 may be formed, for example, using a metallic material and/or a nonmetallic material (e.g., a polymer).

The hinge (or hinge assembly) 430 may connect, for example, the first support member 411 and the second support member 412. The first housing unit 110 of FIG. 1 including the first support member 411 and the second housing unit 120 of FIG. 1 including the second support member 412 may be mutually rotated through the hinge 430.

The front cover 200 may include, for example, the first section ①, the second section ②, and the folding section ③. The flexible display 140 may include the first part 141 overlapping the first section ①, the second part 142 overlapping the second section ②, and the folding part 143 overlapping the folding section ③. The first part 141 may be disposed on the first support member 411, and the second part 142 may be disposed on the second support member 412. The first substrate assembly 421 may be disposed on the first support member 411 between the first support member 411 and the first rear cover 111. The second substrate assembly 422 may be disposed on the second support member 412 between the second support member 412 and the second rear cover 121.

The first substrate assembly 421 may include, for example, a first printed circuit board (PCB) (not shown). The flexible display 140, the camera assembly 470 including the camera device 181 of FIG. 1, the second camera devices 191 and 192 and the flash 193 of FIG. 2, the key input devices 174 of FIG. 1, the sub-display 150 of FIG. 3, or other various electronic components not shown may be electrically connected to the first PCB. According to various embodiments, the first substrate assembly 421 may include the first PCB, a third PCB (not shown) disposed to partially overlap the first PCB, and/or an interposer substrate (not shown) between the first PCB and the third PCB.

The second substrate assembly 422 may include, for example, a second PCB (not shown) electrically connected to the first PCB of the first substrate assembly 421. The second substrate assembly 422 may include various electronic components electrically connected to the second PCB. The electronic components may include, for example, the microphone using the microphone hole 171, the speaker using the speaker hole 172, or the connector using the connector hole 173.

The first battery 441 may be disposed, for example, on the first support member 411 between the first support member 411 and the first rear cover 111. The second battery 442 may be disposed, for example, on the second support member 412 between the second support member 412 and the second rear cover 121. The first battery 441 and/or the second battery 442 is a device for supplying power to at least one component of the electronic device 10, and may include, for example, a non-rechargeable primary battery, a rechargeable secondary battery, or a fuel cell. The first battery 441 or the second battery 442 may be integrally disposed inside the electronic device 10, or may be disposed detachably from the electronic device 10 in an embodiment. According to an embodiment, the first battery 441 or the second battery 442 may be omitted.

The third support member (e.g., a first rear case) 451 may be disposed, for example, between the first support member 411 and the first rear cover 111, and may be coupled to the first support member 411 through a fastening element, such as a bolt. At least a portion of the first substrate assembly 421 may be disposed between the first support member 411 and the third support member 451, and the third support member 451 may cover and protect the first substrate assembly 421. In an embodiment, the third support member 451 may serve as an electromagnetic shield to reduce electromagnetic interference (e.g., electromagnetic interference (EMI)) with an electronic component, such as the first substrate assembly 421.

The fourth support member (e.g., a second rear case) 452 may be disposed, for example, between the second support member 412 and the second rear cover 121, and may be coupled to the second support member 412 through a fastening element, such as a bolt. At least a portion of the second substrate assembly 422 may be disposed between the second support member 412 and the fourth support member 452, and the fourth support member 452 may cover and protect the second substrate assembly 422. The third support member 451 and/or the fourth support member 452 may be formed using a metallic material and/or a nonmetallic material (e.g., a polymer). In an embodiment, the fourth support member 452 may serve as an electromagnetic shield to reduce electromagnetic interference (e.g., electromagnetic interference (EMI)) with an electronic component, such as the second substrate assembly 422. According to an embodiment, the third support member 451 or the fourth support member 452 may be omitted.

The antenna 480 may be disposed, for example, between the second support member 412 and the second rear cover 121. The antenna 480 may be configured in the form of a film, for example, an FPCB. The antenna 480 may include at least one conductive pattern used as a loop-type radiator. For example, the at least one conductive pattern may include a planar spiral conductive pattern (e.g., a planar coil or a pattern coil). The antenna 480 may be electrically connected to a wireless communication circuit disposed on the first substrate assembly 421, and may be used for short-range wireless communication, such as near-field communication (NFC). In another example, the antenna 480 may be used for magnetic secure transmission (MST) of transmitting and/or receiving a magnetic signal. According to various embodiments, the antenna 480 may be electrically connected to a power transmission and reception circuit disposed on the first substrate assembly 421. The power transmission and reception circuit may wirelessly receive power from an external electronic device through the conductive pattern, or may wirelessly transmit power to the external electronic device.

Figure 5:
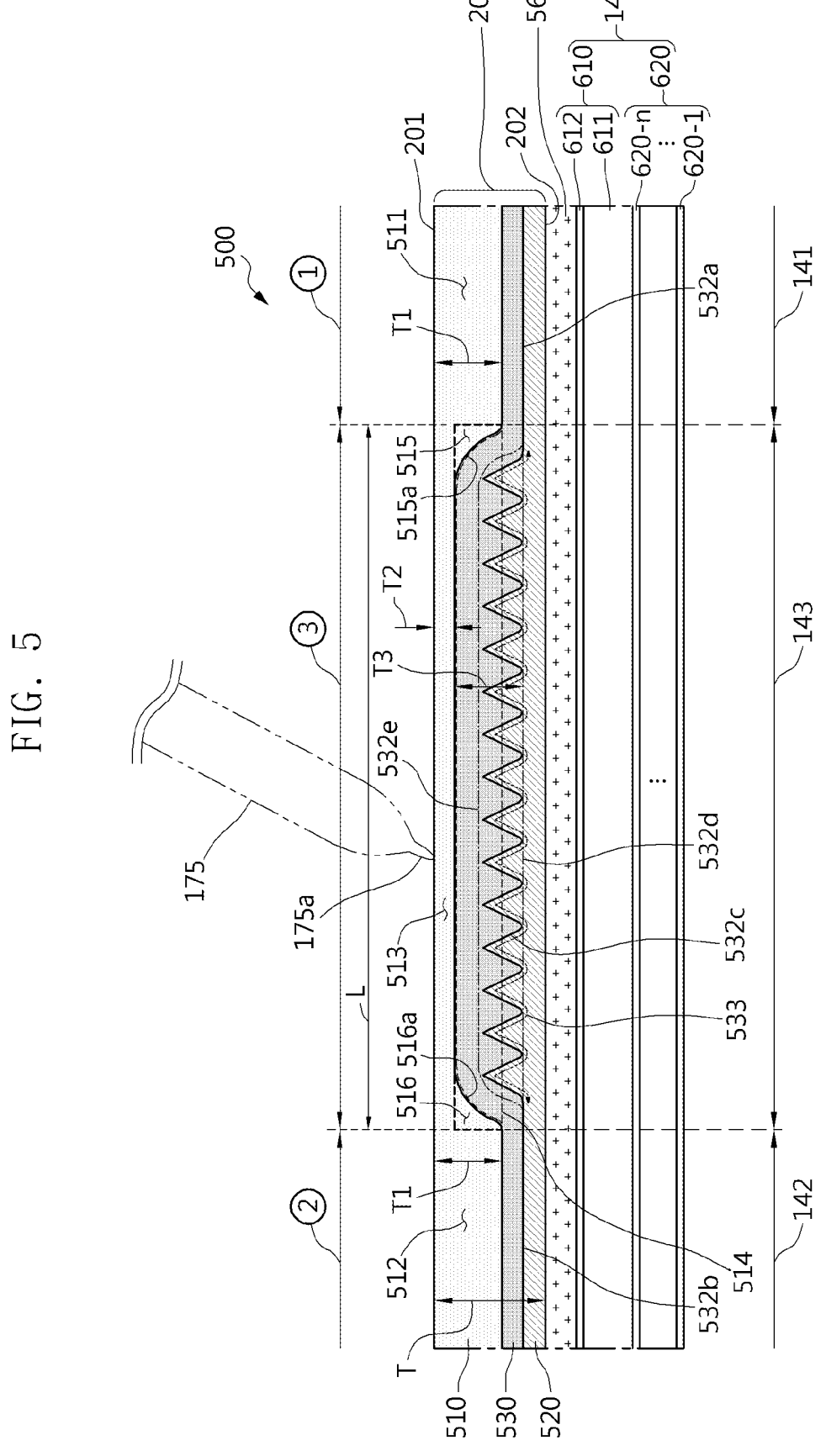
FIG. 5 is a cross-sectional view of a display assembly included in the example electronic device of FIG. 1 in the unfolded state according to various embodiments.
Figure 6:
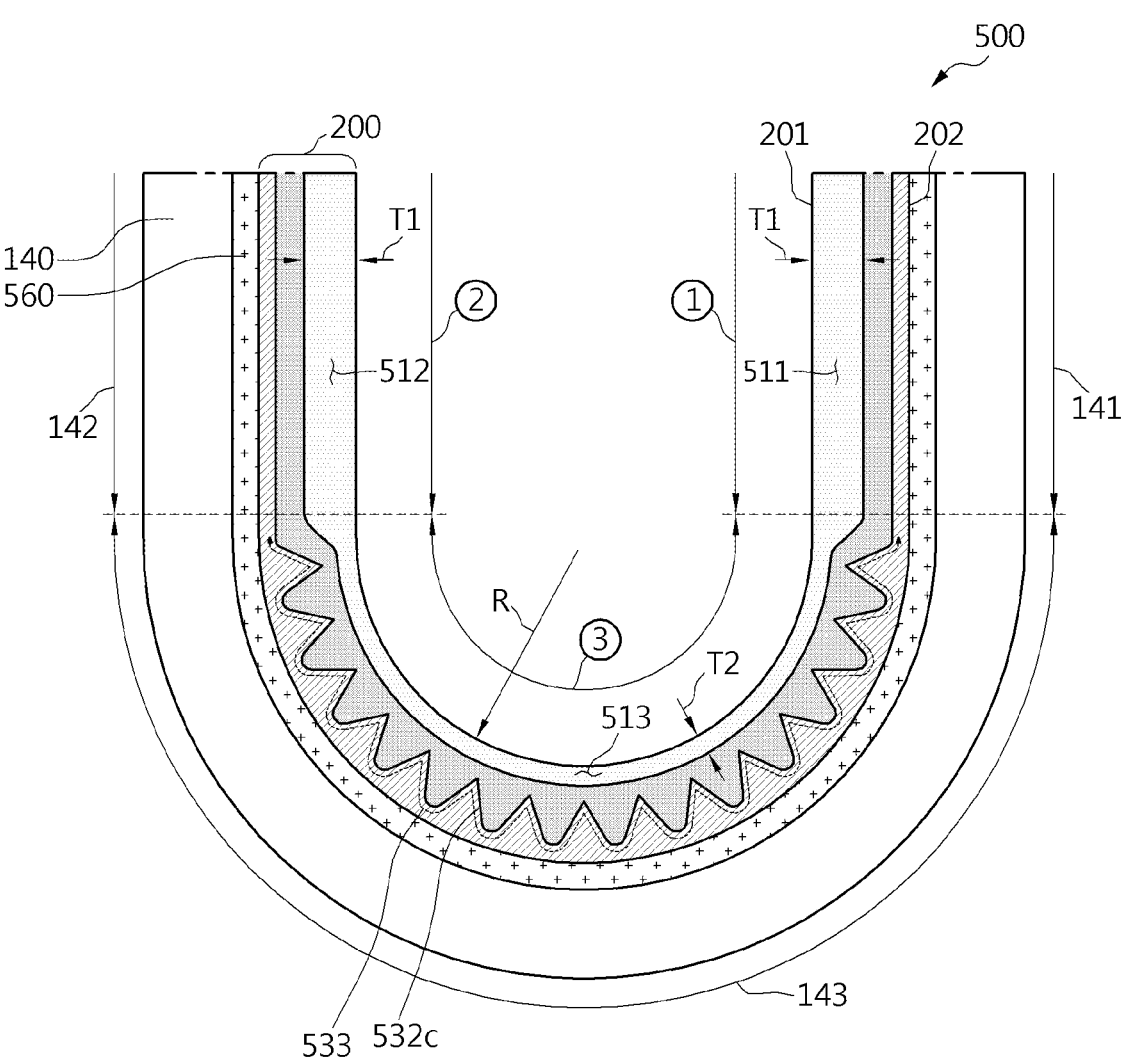
FIG. 6 is a cross-sectional view of the display assembly of FIG. 5 in the folded state according to various embodiments.

FIG. 5 is a cross-sectional view of a display assembly 500 included in the example electronic device 10 of FIG. 1 in the unfolded state according to various embodiments. FIG. 6 is a cross-sectional view of the display assembly 500 of FIG. 5 in the folded state according to various embodiments.

Referring to FIG. 5 and FIG. 6, in an embodiment, the display assembly 500 may include a front cover 200, a flexible display 140, or an optical transparent bonding member 560 between the front cover 200 and the flexible display 140. The front cover 200 and the optical transparent bonding member 560 may be substantially transparent, and light output from the flexible display 140 may pass through the optical transparent bonding member 560 and the front cover 200 to proceed.

According to an embodiment, the flexible display 140 may include a folding part 143, and a first part 141 and a second part 142 positioned with the folding part 143 therebetween. The front cover 200 may include a folding section ③ overlapping the folding part 143, a first section ① overlapping the first part 141, or a second section ② overlapping the second part 142. The folding part 143 of the flexible display 140 and the folding section ③ of the front cover 200 may be bent in a round shape when the electronic device 10 is changed from the unfolded state of FIG. 1 to the folded state of FIG. 3 (see FIG. 6). In the folded state of FIG. 3, the first section ① and the second section ② may be positioned to face each other.

According to an embodiment, the front cover 200 may include a front surface 201 and a rear surface 202 positioned opposite to the front surface 201. The front surface 201 of the front cover 200 may form the front surface 100A of the electronic device 10 of FIG. 1. The front surface 201 and the rear surface 202 may be substantially parallel, and the thickness T of the front cover 200 (e.g., the distance between the front surface 201 and the rear surface 202) may be substantially the same in the first section ①, the second section ②, and the folding section ③.

According to an embodiment, the front cover 200 may include a first layer 510, a second layer 520, or a third layer 530. The first layer 510 may form the front surface 201 of the front cover 200. The second layer 520 may be positioned between the first layer 510 and the flexible display 140, and may form the rear surface 202 of the front cover 200. The third layer 530 may be positioned between the first layer 510 and the second layer 520.

According to an embodiment, the first layer 510 may include glass. The glass may be formed, for example, using an element, such selenium and sulfur, an oxide, such as silicon, boron, and germanium, or an inorganic material, such as oxide salts, a sulfide, a selenide, and a halide. The glass may include, for example, a basic network-form material, or may further include an auxiliary material chemically bonded thereto to have a property, such as mechanical strength, chemical durability, transparency, or electrical insulation. For example, the first layer 510 may be formed through an operation of forming thin glass and an operation of reinforcing the thin glass. The thin glass may have a thickness of, for example, about 100 micrometers (μm) to about 1000 μm. The operation of reinforcing the thin glass may include, for example, injecting a special material into the thin glass by a predetermined depth or more. The first layer 510 may form the front surface 100A (see FIG. 1) of the electronic device 10, and may have natural smoothness of glass or surface evenness. The front cover 200 including the glass may have a higher hardness than a plastic film (e.g., a polyimide film) and/or excellent resistance to scratches.

According to various embodiments, the first layer 510 may include glass having various optical properties. For example, the first layer 510 may be configured to allow or not to allow a specific wavelength band, such as ultraviolet or infrared rays, to pass.

According to various embodiments, the first layer 510 may include glass having a relatively low dielectric constant to prevent energy loss due to the glass. For example, the first layer 510 may include glass having a relatively low dielectric loss. Accordingly, it is possible to reduce performance degradation of at least one component (e.g., the electromagnetic induction panel, a touch sensing circuit, or the antenna) which forms an electric field or magnetic field toward the front cover 200. In an embodiment, when sodium ions or the like are present in the glass, electric charges may be transported (ion conduction) under an action of an electric field, and thus the first layer 510 may include glass having a low alkali content, such as sodium.

According to an embodiment, the first layer 510 may include a first area 511 included in the first section ①, a second area 512 included in the second section ②, or a folding area 513 included in the folding section ③. The first area 511 and/or the second area 512 may have a first thickness T1, and at least a portion of the folding area 513 may have a second thickness T2 smaller than the first thickness T1. The folding area 513 may include a recess 514 formed to face the third layer 530. In the first layer 510, the folding section ③ may have a smaller thickness than the first section ① and the second section ② due to the recess 514. The second thickness T2 of the folding area 513 may correspond to a thickness which allows the folding area 513 with a length L connecting the first area ① and the second area ② to be bent with a radius of curvature R (e.g., about 1.5 mm) without damage as in a folded state of FIG. 6. The first area 511 is a portion which is not bendable compared to the folding area 513, and may provide rigidity to the first section ①. The second area 512 is a portion which is not bendable compared to the folding area 513, and may provide rigidity to the second section ②. According to an embodiment, the first thickness T1 of the first area 511 and/or the second area 512 may be a value ranging from about 100 μm to about 1000 μm, and the second thickness T2 of the folding area 513 may have a value which is smaller than the first thickness T1 and ranges from about 10 μm to about 100 μm.

According to various embodiments, the folding area 513 may include a first rib 515 adjacently connected to the first area 511. The first rib 515 may include a first slope 515a connecting surfaces (not shown) having different heights due to a thickness difference between the first area 511 and the folding area 513. The folding area 513 may include a second rib 516 adjacently connected to the second area 512. The second rib 516 may include a second slope 516a connecting surfaces (not shown) having different heights due to a thickness difference between the second area 512 and the folding area 513. The first slope 515a and/or the second slope 516a may include a curved surface. The first rib 515 may prevent stress from being concentrated on a connecting portion between the first area 511 and the folding area 513 when the folding section ③ is bent. The first rib 515 may provide resistance for the connecting portion between the first area 511 and the folding area 513 to be able to withstand impact when the folding section ③ is bent. The second rib 516 may prevent stress from being concentrated on a connecting portion between the second area 512 and the folding area 513 when the folding section ③ is bent. The second rib 516 may provide resistance for the connecting portion between the second area 512 and the folding area 513 to be able to withstand impact when the folding section ③ is bent.

According to various embodiments, the recess 514 may be formed by using various methods, such as a laser, CNC processing, scratching, blasting, polishing, or etching (e.g., chemical etching).

According to an embodiment, the third layer 530 may reinforce the first layer 510. For example, impact resistance or durability of the first layer 510 may be reinforced by the third layer 530. The folding area 513 has a smaller thickness than the first area 511 and the second area 512, and may thus be relatively vulnerable to an external impact or external pressure. For example, when a user input is performed by a pen tip 175a of the pen input device 175 coming into contact with the first layer 510, the folding area 513 may have a risk of being damaged by an external impact or external pressure exerted by the pen tip 175a due to the smaller thickness than that of the first area 511 and the second area 512. The folding area 513 may have limitation in increasing the thickness thereof for flexibility without damage. According to an embodiment, the third layer 530 bonded to the first layer 510 may prevent the first layer 510 from being damaged by an external impact or external pressure exerted to the first layer 510. The third layer 530 may relieve stress that may occur in the first layer 510 due to the external impact or external pressure.

According to an embodiment, the third layer 530 may have hardness to prevent damage to the folding area 513 by an external impact or external pressure. For example, when a user input is performed by the pen tip 175a of the pen input device 175 coming into contact with the folding area 513, the hardness of the third layer 530 may provide resistance to local plastic deformation of the folding area 513 due to an external impact or external pressure by the pen input device 175, thereby preventing the folding area 513 from being damaged. According to an embodiment, the third layer 530 may have a hardness of about 20 to about 90, based on a shore D hardness scale. The thickness of the third layer 530 in the folding section ③ may be formed to reduce a decrease in flexibility of the folding section ③, based on a material (or a mechanical property, such as hardness, based on the material) thereof. For example, when the third layer 530 is formed using a material having a first hardness, the third layer 530 may have a first thickness in the folding section ③, and when the first layer 510 is formed using a material having a second hardness greater than the first hardness, the third layer 530 may have a second thickness less than the first thickness in the folding section ③. According to an embodiment, the third layer 530 may have elasticity (or resilience) to be restored substantially without predetermined deformation when the front cover 200 is changed from the folded state of FIG. 6 to the unfolded state of FIG. 5.

The third layer 530 may include, for example, a first bonding surface 532a of the first section ①, a second bonding surface 532b of the second section ②, and a third bonding surface 532c of the folding section ③ as bonding surfaces with the second layer 520. According to an embodiment, the third bonding surface 532c of the folding section ③ may include a pattern 533 including a plurality of grooves or bumps. The pattern 533 including the plurality of grooves may reduce a decrease in flexibility of the folding section ③ due to the third layer 530 bonded to the first layer 510. For example, when the third bonding surface 532c is formed to be smoothly connected with the first bonding surface 532a and the second bonding surface 532b as indicated by a reference numeral '532d', the thickness T3 of the third layer 530 in the folding section ③ may reduce the flexibility of the folding section ③. According to an embodiment, the third bonding surface 532c may include the pattern 533 of the plurality of grooves in a concave shape toward the first layer 510, thus reducing a decrease in flexibility of the folding section ③ due to the third layer 530 bonded to the first layer 510. According to an embodiment, the third bonding surface 532c may be configured in a convex shape toward the first layer 510 as indicated by a reference numeral '532e'.

According to an embodiment, the plurality of grooves included in the pattern 533 may have a triangular cross-section. According to various embodiments, the number or cross-sectional shape of the plurality of grooves included in the pattern 533 may vary without being limited to the embodiment of FIG. 5. A gap between the plurality of grooves included in the pattern 533 may be constant, or may not be constant in an embodiment.

Figure 7A:
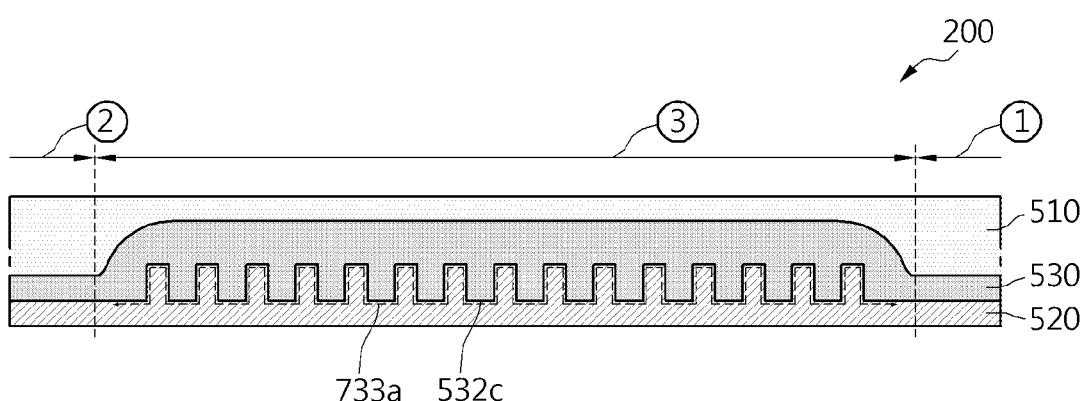
FIG. 7A is a cross-sectional view of an example front cover according to various embodiments.
Figure 7B:
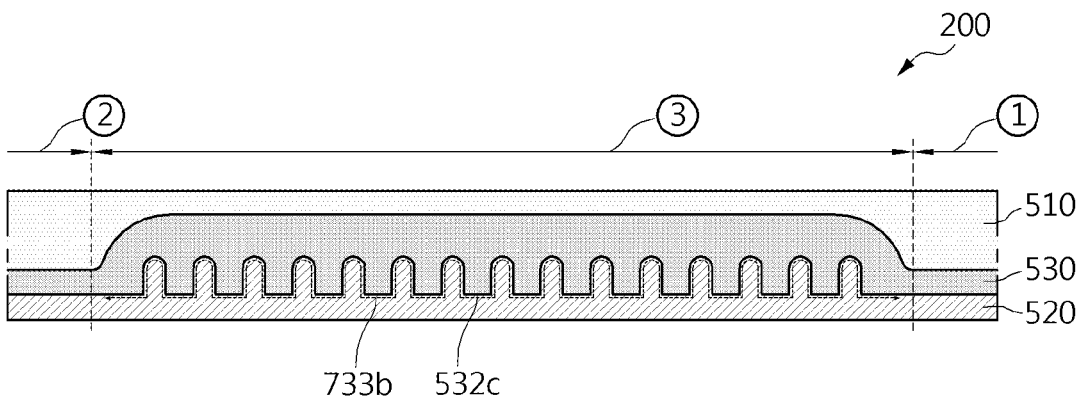
FIG. 7B is a cross-sectional view of an example front cover according to various embodiments.

FIG. 7A is a cross-sectional view of the example front cover 200 according to various embodiments. FIG. 7B is a cross-sectional view of the example front cover 200 according to various embodiments. Referring to FIG. 7A, in various embodiments, a pattern 733a formed on the third bonding surface 532c in the folding section ③ may include a plurality of grooves having a rectangular cross-sectional shape. Referring to FIG. 7B, in various embodiments, a pattern 733b formed on the third bonding surface 532c in the folding section ③ may have a plurality of grooves having a curved surface toward the first layer 510 as compared to the embodiment of FIG. 7A. The patterns formed on the third bonding surface 532c in the folding section ③ may be configured in various other shapes for reducing a decrease in flexibility of the folding section ③ due to the third layer 530 bonded to the first layer 510.

Referring to FIG. 5 or FIG. 6, in an embodiment, the second layer 520 may cover the third layer 530 to form the smooth rear surface 202 for bonding with the flexible display 140. The second layer 520 may have hardness or ductility to reduce a decrease in flexibility of the folding section ③ due to the second layer 520 bonded to the third layer 530. For example, the second layer 520 may have lower hardness than the third layer 530. For example, the second layer 520 may have higher ductility than the third layer 530. According to an embodiment, the second layer 520 may have an elongation rate of about 4% to about 20%. When the front cover 200 is changed from the folded state of FIG. 6 to the unfolded state of FIG. 5, the second layer 520 may be at least partially affected by the elasticity (or restoring force) of the third layer 530, thus being restored substantially without predetermined deformation.

According to an embodiment, the second layer 520 or the third layer 530 may include an acryl-based, urethane-based, or silicone-based organic material.

According to an embodiment, the front cover 200 may be configured by stacking the second layer 520 and the third layer 530 on the first layer 510 including the recess 514. For example, the second layer 520 or the third layer 530 may be formed using an ultraviolet rays (UV) molding liquid. The first layer 510 may be placed on a mold (e.g., a UV molding mold) into which the UV molding liquid is injected, and then compressed with a roller, and thus the UV molding liquid may be evenly spread between the first layer 510 and the mold. According to an embodiment, a primer may be applied to the first layer 510 by a method, such as vacuum deposition or spattering, after which the first layer 510 may be placed on the mold into which the UV molding liquid is injected, and then compressed. In this case, although not shown in FIG. 5 or FIG. 6, a bonding layer including a primer may be disposed between the first layer 510 and the third layer 530.

The bonding layer including the primer may tightly bond the first layer 510 and the third layer 530, thereby improving bonding strength therebetween. When the first layer 510 is irradiated with ultraviolet rays, the UV molding liquid may react to the ultraviolet rays transmitted through the first layer 510 to be cured, thereby forming a sheet in a form in which the third layer 530 is attached to the first layer 510. The pattern 533 of the third layer 530 may be formed by substantially transferring a pattern included in the mold. The sheet including the first layer 510 and the third layer 530 may be placed on the mold (e.g., the UV molding mold) into which the UV molding liquid is injected, and then compressed with the roller, and thus the UV molding liquid may be evenly spread between the third layer 530 and the mold. According to various embodiments, the primer may be applied to the sheet, after which the sheet may be placed on the mold into which UV molding liquid is injected, and be compressed with the roller. In this case, although not shown in FIG. 5 or FIG. 6, a bonding layer including the primer may be disposed between the second layer 520 and the third layer 530. The bonding layer including the primer may tightly bond the second layer 520 and the third layer 530, thereby improving bonding strength therebetween. When the sheet is irradiated with ultraviolet rays, the UV molding liquid may react to the ultraviolet rays transmitted through the sheet to be cured, thereby forming the front cover 200 in a form in which the second layer 520 is attached to the sheet. According to various embodiments, the front cover 200 may be formed by externally processing a composite sheet manufactured by stacking a plurality of layers on a glass sheet. The composite sheet may include a plurality of areas corresponding to the front cover 200, and may be manufactured by a method substantially the same as a method of stacking the second layer 520 and the third layer 530 on the first layer 510 by using the UV molding liquid. The front cover 200 may be formed by various other stacking methods.

According to one embodiment, in the folded state of FIG. 6, the first section ① and the second section ② may be substantially parallel, or may form a narrow angle (e.g., an angle of about 0 degrees to about 10 degrees). In the folded state of FIG. 6, the third section ③ may be bent with the radius of curvature R. The radius of curvature R may be provided to prevent the front cover 200 and the flexible display 140 from being damaged due to internal stress caused by bending while achieving slimness of the electronic device 10 in the folded state (see FIG. 3) (e g, minimizing the separation distance between the first section ① and the second section ②). The radius of curvature R may be formed based on a folding structure of the foldable housing 100 of FIG. 1.

According to an embodiment, the third layer 530 may include a material for increasing an interfacial bonding force (or bonding strength) with the first layer 510. The third layer 530 may include a material for increasing an interfacial bonding force with the second layer 520. The interfacial bonding force may include mechanical strength indicating resistance to destruction by an external force, or environmental strength indicating resistance to destruction by an environment (e.g., water and heat). According to an embodiment, the third layer 530 may include a material which may be strongly bonded to both the first layer 510 and the second layer 520.

According to an embodiment, the third layer 530 may include a material for minimizing a difference in refractive index between the first layer 510 and the third layer 530. When the difference in refractive index between the first layer 510 and the third layer 530 is minimized, the reflectance of an interface between the first layer 510 and the third layer 530 may be reduced. When the reflectance of the interface between the first layer 510 and the third layer 530 is reduced, reflection on the interface and light loss due to the reflection may be reduced, and thus a clear image may be displayed on the screen. According to an embodiment, the difference in refractive index between the first layer 510 and the third layer 530 may be about 0.01 or less, which is a level enabling a clear image to be secured.

According to an embodiment, the first layer 510 and the third layer 530 may be bonded substantially without an air gap. The air gap may cause loss of light from the flexible display 140, thus causing a deterioration in image quality. The third layer 530 may be formed by applying a liquid material and then curing the same, thereby reducing occurrence of an air gap between the first layer 510 and the third layer 530.

According to an embodiment, the second layer 520 may include a material for minimizing a difference in refractive index between the third layer 530 and the second layer 520. When the difference in refractive index between the second layer 520 and the third layer 530 is minimized, the reflectance of an interface between the second layer 520 and the third layer 530 may be reduced. When the reflectance of the interface between the second layer 520 and the third layer 530 is reduced, reflection on the interface and light loss due to the reflection may be reduced, and thus a clear image may be displayed on the screen. According to an embodiment, the difference in refractive index between the second layer 520 and the third layer 530 may be about 0.01 or less, which is a level enabling a clear image to be secured.

According to an embodiment, the second layer 520 and the third layer 530 may be bonded substantially without an air gap. The air gap may cause loss of light from the flexible display 140, thus causing a deterioration in image quality. The second layer 520 may be formed by applying a liquid material and then curing the same, thereby reducing occurrence of an air gap between the second layer 520 and the third layer 530.

According to an embodiment, the optical transparent bonding member 560 may include a material for minimizing a difference in refractive index between the front cover 200 (e.g., the second layer 520) and the flexible display 140. When the difference in refractive index between the front cover 200 and the flexible display 140 is minimized due to the optical transparent bonding member 560, the reflection of an interface between the front cover 200 and the flexible display 140 may be reduced due to the optical transparent bonding member 560. When the reflection of the interface between the front cover 200 and the flexible display 140 is reduced due to the optical transparent bonding member 560, reflection on the interface and light loss due to the reflection may be reduced, and thus a clear image may be displayed on the screen. According to an embodiment, the difference in refractive index between the front cover 200 and the flexible display 140 may be about 0.01 or less, which is a level enabling a clear image to be secured.

According to an embodiment, the optical bonding member 560 may include an optical clear adhesive (OCA), an optical clear resin (OCR), or a super view resin (SVR). The front cover 200 and the flexible display 140 may be bonded without an air gap through the optical transparent bonding member 560. The air gap may cause loss of light from the flexible display 140, thus causing a deterioration in image quality. The air gap between the front cover 200 and the flexible display 140 may be filled with the optical transparent bonding member 560, and thus the loss of light output from the flexible display 140 may be reduced, thereby displaying a clear image on the screen.

According to an embodiment, the flexible display 140 may include a display panel 610 and a lower panel 620 bonded to the display panel 610. A bonding member (not shown) of various polymers may be disposed between the display panel 610 and the lower panel 620. The optical transparent bonding member 560 may be disposed between the second layer 520 of the front cover 200 and the display panel 610 of the flexible display 140. The display panel 610 may be disposed between the optical transparent bonding member 560 and the lower panel 620. The display panel 610 may include a light emitting layer 611. The light emitting layer 611 may include, for example, a plurality of pixels configured with a light emitting device, such as organic light emitting diodes (OLEDs) or micro LEDs. The light emitting layer 611 may include at least one thin film transistor (TFT) for controlling the plurality of pixels. The at least one TFT may control a current to the light emitting device to turn on or off the pixels or to adjust the brightness of the pixels. The at least one TFT may be configured, for example, as an amorphous silicon (a-Si) TFT or a low-temperature polycrystalline silicon (LTPS) TFT. The light emitting layer 611 may include a storage capacitor, and the storage capacitor may maintain a voltage signal to the pixels, may maintain a voltage applied to the pixels within one frame, or may reduce a change in gate voltage of the TFT due to current leakage during a light emission time. The storage capacitor may maintain a voltage applied to the pixels at a predetermined time interval by a routine (e.g., initialization or data writing) of controlling the at least one TFT.

In an embodiment, the light emitting layer 611 may include a pixel layer, a thin film transistor (TFT) film, and/or an encapsulation (or encapsulation layer) (e.g., a thin-film encapsulation (TFE)). The pixel layer may include, for example, a plurality of pixels configured with a light emitting device, such as OLEDs or micro LEDs. The pixel layer may be disposed on the TFT film by organic evaporation. The TFT film may be positioned between the pixel layer and a base film. The TFT film may refer to a film structure in which at least one TFT is disposed on a flexible substrate (e.g., a PI film) through a series of processes, such as deposition, patterning, and etching. The at least one TFT may control a current to the light emitting device of the pixel layer to turn on or off the pixels or to adjust the brightness of the pixels. The at least one TFT may be configured, for example, as an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The light emitting layer 611 may include a storage capacitor, and the storage capacitor may maintain a voltage signal to the pixels, may maintain a voltage applied to the pixels within one frame, or may reduce a change in gate voltage of the TFT due to current leakage during a light emission time. The storage capacitor may maintain a voltage applied to the pixels at a predetermined time interval by a routine (e.g., initialization or data writing) of controlling the at least one TFT. In an embodiment, the light emitting layer 611 may be configured based on the OLEDs, and the encapsulation may cover the pixel layer. An organic material emitting light and an electrode in the OLEDs very sensitively react to oxygen and/or moisture, and may thus lose a light-emitting property. The encapsulation may seal the pixel layer to prevent oxygen and/or moisture from penetrating into the OLEDs. The base film may include a flexible film formed using a polymer, such as polyimide or polyester (PET), or plastic. The base film may serve to support and protect the light emitting layer 611. In an embodiment, the base film may be referred to as a protective film, a back film, or a back plate.

The display panel 610 may include an optical layer 612 disposed between the light emitting layer 611 and the optical transparent bonding member 560. An optical transparent bonding member (not shown), such as OCA, OCA, OCR, or SVR, may be disposed between the light emitting layer 611 and the optical layer 612. The optical layer 612 may improve image quality of the screen. The optical layer 612 may include, for example, a retardation layer (or retarder) or a polarizing layer (or polarizer) disposed between the retardation layer and the front cover 200. The polarizing layer and the retardation layer may improve outdoor visibility of the screen. According to various embodiments, a single layer into which a polarizing layer and a retardation layer are combined may be provided, and this layer may be defined as a 'circular polarizing layer'. In an embodiment, the polarizing layer (or circular polarizing layer) may be omitted, in which case a black pixel define layer (PDL) and/or a color filter may be included to replace the polarizing layer.

According to an embodiment, the lower panel 620 may include a plurality of layers 620-1, . . . , 620-n (n 2) for various functions. A bonding member (not shown) of various polymers may be disposed between the plurality of layers 620-1, . . . , 620-n. Some of the plurality of layers 620-1, . . . , 620-n included in the lower panel 620 may protect the display panel 610 from an external impact while supporting the display panel 610. Some of the plurality of layers 620-1, . . . , 620-n included in the lower panel 620 may block external light or light generated from the display panel 610. Some (e.g., reference numeral '620-1') of the plurality of layers 620-1, . . . , 620-n included in the lower panel 620 may absorb or block electromagnetic waves, and may be formed using various conductive materials (e.g. copper). Some (e.g., reference numeral '620-1') of the plurality of layers 620-1, . . . , 620-n included in the lower panel 620 may diffuse, disperse, or radiate heat. The lower panel 620 may include various layers having various other functions.

According to an embodiment, the lower panel 620 may include a light blocking layer, a buffer layer, or a lower layer. The light blocking layer may be positioned, for example, between the base film of the display panel 610 and the buffer layer. The buffer layer may be positioned between the light blocking layer and the lower layer. The light blocking layer may at least partially block light incident from the outside. For example, the light blocking layer may include an embossing layer. The embossing layer may be a black layer including an uneven pattern. The buffer layer may relieve an external impact applied to the flexible display 140. For example, the buffer layer may include a sponge layer or a cushion layer. The lower layer may diffuse, disperse, or radiate heat generated from the electronic device 10 (see FIG. 1) or the flexible display 140. The lower layer may absorb or block electromagnetic waves. The lower layer may relieve an external impact applied to the electronic device 10 or the flexible display 140. For example, the lower layer may include a composite sheet or a conductive sheet. In an embodiment, the composite sheet may be a sheet into which layers or sheets having different properties are combined and processed. For example, the composite sheet may include at least one of polyimide or graphite. The composite sheet may be replaced with a unitary sheet including one material (e.g., polyimide or graphite). The composite sheet may be positioned between the buffer layer and the conductive sheet. The conductive sheet may serve to shield the flexible display 140 from EMI. The conductive sheet may include a variety of different metallic materials (e.g., copper). In an embodiment, at least a portion of the lower layer may be a conductive member (e.g., a metal plate), which may help reinforce rigidity of the electronic device 10 or the flexible display 140 and may be used to block ambient noise and to disperse heat emitted from a peripheral heat release component (e.g. a display driving circuit (e.g. a DDI)). The conductive member may include, for example, at least one of copper (Cu), aluminum (Al), stainless steel (SUS), or CLAD (e.g., a stacked member in which SUS and Al are alternately disposed). The lower layer may include various layers for various other functions. According to various embodiments (not shown), at least one additional polymer layer (e.g., a layer including PI, PET, or TPU) may be further disposed on a rear surface of the display panel 610 in addition to the base film. In various embodiments, at least one of the plurality of layers (e.g., the light blocking layer, the buffer layer, the composite sheet, and the conductive sheet) included in the lower panel 620 may be omitted. In various embodiments, the arrangement order of the plurality of layers included in the lower panel 620 is not limited to the illustrated example, and may be variously changed.

According to an embodiment, some of the plurality of layers 620-1, . . . , 620-n included in the lower panel 620 may include a digitizer for detecting the pen input device 175. The digitizer may be, for example, an electromagnetic induction panel for sensing a pen input device of a magnetic field type. In an embodiment, the electromagnetic induction panel (e.g., the digitizer) may be positioned between the buffer layer and the lower layer of the lower panel 620. In an embodiment, the electromagnetic induction panel may be positioned between the conductive sheet and the composite sheet of the lower layer included in the lower panel 620. In an embodiment, the electromagnetic induction panel may be positioned between the light blocking layer and the buffer layer of the lower panel 620. The electromagnetic induction panel may be configured in a form, such as a flexible film or a flexible sheet. The electromagnetic induction panel may be formed, for example, using a flexible PCB. When an alternating current is supplied to the electromagnetic induction panel, an electromagnetic field may be formed by a plurality of electrode patterns included in the electromagnetic induction panel. The pen input device 175 may be configured as an electromagnetic induction type (e.g., an electro-magnetic resonance (EMR) type). The pen input device 175 may include a resonance circuit, and the resonance circuit may be linked with the electromagnetic induction panel. When the pen tip of the pen input device 175 is brought close to the screen of the electronic device 10, a current may flow in a coil included in the resonance circuit of the pen input device 175 by electromagnetic induction. The pen input device 175 may generate a signal (e.g., a radio frequency signal) (e.g., a position signal, a pen pressure signal, and/or an angle signal) relating to a user input on the screen using energy supplied from the electromagnetic induction panel, and may transmit the signal to the screen (e.g., the electromagnetic induction panel). The electromagnetic induction panel may include a shielding sheet. The shielding sheet may prevent mutual interference between components included in the electronic device 10 by an electromagnetic field generated by the components. The shielding sheet may block the electromagnetic field generated by the components, thereby enabling the input from the pen input device 175 to be accurately transmitted to a coil included in the electromagnetic induction panel. In an embodiment, the electromagnetic induction panel may be defined as a component of the flexible display 140. According to an embodiment, the pen input device 175 may be configured as an active electrical stylus (AES) method or an electric coupled resonance (ECR) type. In this case, the electromagnetic induction panel may be omitted. For example, in an embodiment in which the pen input device 175 generates a signal by using power of a battery included in the pen input device 175, the electromagnetic induction panel may be omitted.

According to an embodiment (not shown), the flexible display 140 may include a touch sensing circuit (e.g., a touch sensor). The touch sensing circuit may be configured with a transparent conductive layer (or film) based on various conductive materials, such as indium tin oxide (ITO). According to an embodiment, the touch sensing circuit may be disposed between the front cover 200 and the optical layer 612 (e.g., an add-on type). According to another embodiment, the touch sensing circuit may be disposed between the optical layer 612 and the light emitting layer 611 (e.g., an on-cell type). According to still another embodiment, the light emitting layer 611 may include the touch sensing circuit or a touch sensing function (e.g., an in-cell type).

According to various embodiments (not shown), the flexible display 140 may further include a pressure sensor capable of measuring the strength (pressure) of a touch.

According to various embodiments (not shown), the display panel 610 may be based on the OLEDs, and may include an encapsulation layer (e.g., a thin-film encapsulation (TFE)) disposed between the light emitting layer 611 and the optical layer 612. The encapsulation layer may seal the light emitting layer 611 to prevent oxygen and/or moisture from penetrating into the OLEDs. According to various embodiments (not shown), the flexible display 140 may include a conductive pattern, such as a metal mesh (e.g., an aluminum metal mesh), as a touch sensing circuit disposed on the encapsulation layer and the optical layer 612. For example, in response to bending of the flexible display 140, the metal mesh may have higher durability than the transparent conductive layer configured with ITO.

According to various embodiments, the plurality of layers included in the display panel 610 or the lower panel 620, a stacking structure thereof, or a stacking order may vary. According to various embodiments, the flexible display 140 may be configured by omitting some of the components or adding another component according to a provision form thereof or a convergence trend.

According to an embodiment, the impact resistance of the first layer 510 including the glass may be improved through reinforcement. The reinforcement may include, for example, a method of substituting sodium on the surface of the first layer 510 with potassium having a large ionic radius and applying compressive stress to the surface as chemical reinforcement (e.g., an ion exchange method). The glass may expand after the chemical reinforcement. Since the folding area 513 is thinner than the first area 511 or the second area 512 in the first layer 510, the amount of expansion of the first area 511 and/or the second area 512 after the chemical reinforcement may be different from that of the folding area 513. Thus, after the chemical reinforcement, the first section ① and/or the second section ② may be deformed to be uneven. Hereinafter, FIG. 8 illustrates another embodiment for preventing deformation of the first layer 510 due to the uneven thickness of glass in chemical reinforcement.

Figure 8:
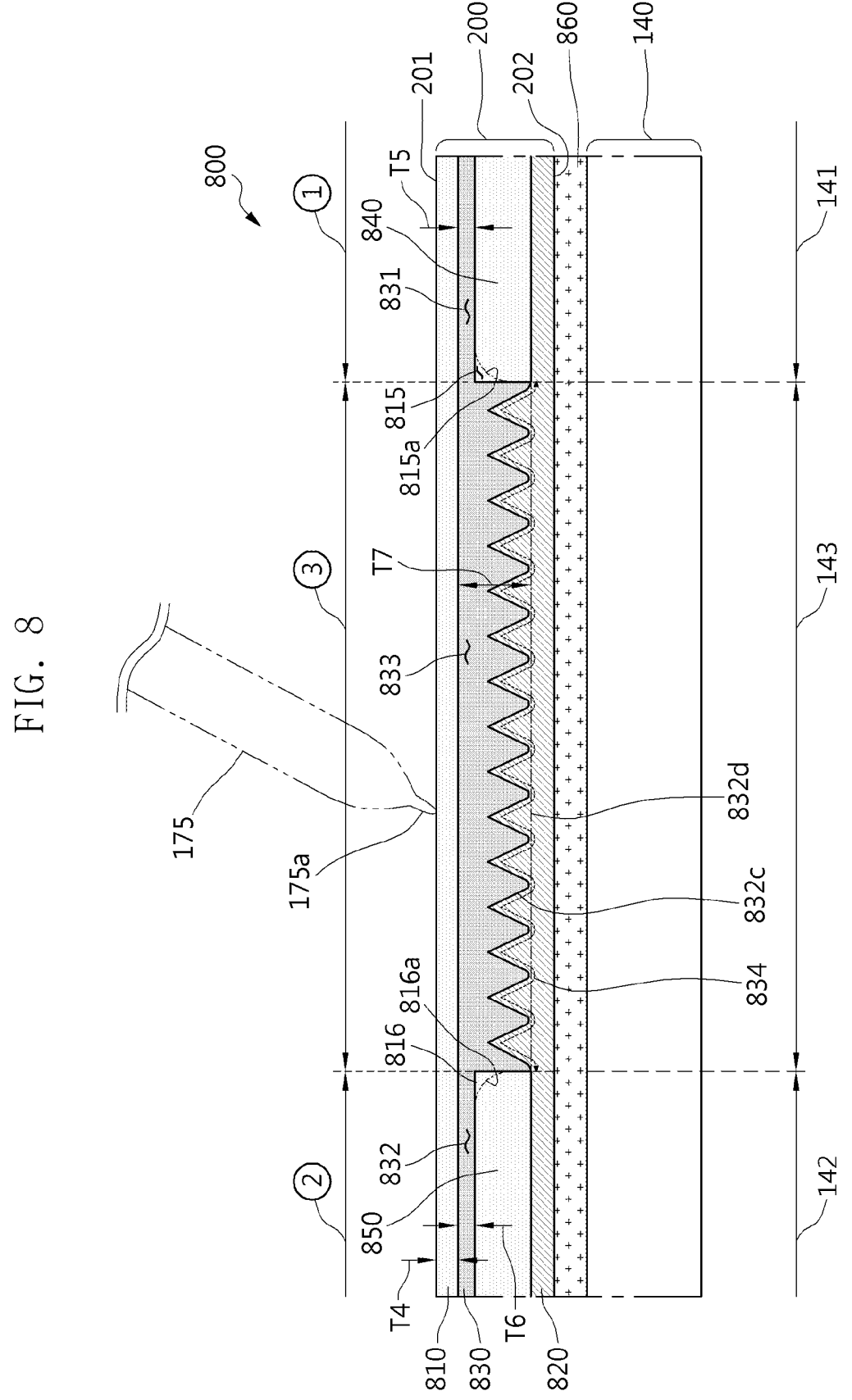
FIG. 8 is a cross-sectional view of a display assembly included in the example electronic device of FIG. 1 in the unfolded state according to various embodiments.

FIG. 8 is a cross-sectional view of an example display assembly 800 included in the electronic device 10 of FIG. 1 in the unfolded state according to various embodiments.

Referring to FIG. 8, in an embodiment, the display assembly 800 may include a front cover 200, a flexible display 140, or an optical transparent bonding member 860 (e.g., OCA, OCA, OCR, or SVR) between the front cover 200 and the flexible display 140. The front cover 200 and the optical transparent bonding member 860 may be substantially transparent, and light output from the flexible display 140 may pass through the optical transparent bonding member 860 and the front cover 200 to proceed. A redundant description of some of reference numerals of FIG. 8 is not repeated here.

According to an embodiment, the front cover 200 may include a folding section ③ overlapping a folding part 143 of the flexible display 140, a first section ① overlapping a first part 141 of the flexible display 140, or a second section ② overlapping a second part 142 of the flexible display 140. The front cover 200 may include a front surface 201 and a rear surface 202 positioned opposite to the front surface 201. The front surface 201 of the front cover 200 may form the front surface 100A of the electronic device 10 of FIG. 1. The front surface 201 and the rear surface 202 may be substantially parallel, and the thickness of the front cover 200 (e.g., the distance between the front surface 201 and the rear surface 202) may be substantially the same in the first section ①, the second section ②, and the folding section ③.

According to an embodiment, the front cover 200 may include a first layer 810, a second layer 820, a third layer 830, a fourth layer 840, or a fifth layer 850. The first layer 810 may form the front surface 201 of the front cover 200. The second layer 820 may form the rear surface 202 of the front cover 200. The third layer 830 may be positioned between the first layer 810 and the second layer 820. The fourth layer 840 and the fifth layer 850 may be positioned between the third layer 830 and the second layer 820.

According to an embodiment, the first layer 810 may include glass. The thickness T4 of the first layer 810 may be substantially the same in the first section ①, the second section ②, and the folding section ③. The first layer 810 may form the front surface 100A (see FIG. 1) of the electronic device 10. The thickness T4 of the first layer 810 may be about 10 μm to about 100 μm, and the folding section ③ may have flexibility. The first layer 810 may be formed through an operation of forming thin glass and an operation of reinforcing the thin glass. Reinforcement may include, for example, a method of substituting sodium on the surface of the first layer 810 with potassium having a large ionic radius and applying compressive stress to the surface as chemical reinforcement (e.g., an ion exchange method). The glass may expand after the chemical reinforcement. Since the first layer 810 has a regular thickness T4, the amount of expansion after the chemical reinforcement may be substantially constant in the first section ①, the second section ②, and the folding section ③.

According to various embodiments, the first layer 810 may include glass having various optical properties. For example, the first layer 810 may be configured to allow or not to allow a specific wavelength band, such as ultraviolet or infrared rays, to pass.

According to various embodiments, the first layer 810 may include glass having a relatively low dielectric constant to prevent energy loss due to the glass. For example, the first layer 810 may include glass having a relatively low dielectric loss. Accordingly, it is possible to reduce performance degradation of at least one component which forms an electric field or magnetic field toward the front cover 200. In another embodiment, when sodium ions or the like are present in the glass, electric charges may be transported (ion conduction) under an action of an electric field, and thus the first layer 810 may include glass having a low alkali content, such as sodium.

According to an embodiment, the third layer 830 may reinforce the first layer 810. For example, impact resistance or durability of the first layer 810 may be reinforced by the third layer 830. The first layer 810 formed using the thin glass may be vulnerable to an external impact or external pressure. For example, when a user input is performed by a pen tip 175a of the pen input device 175 coming into contact with the first layer 810, the first layer 810 may have a risk of being damaged by an external impact or external pressure exerted by the pen tip 175a. The first layer 810 may have limitation in increasing the thickness thereof for flexibility without damage. According to an embodiment, the third layer 830 bonded to the first layer 810 may prevent the first layer 810 from being damaged by an external impact or external pressure exerted to the first layer 810. The third layer 830 may relieve stress that may occur in the first layer 810 due to the external impact or external pressure.

According to an embodiment, the third layer 830 may have hardness to prevent damage to the first layer 810 by an external impact or external pressure. For example, the third layer 830 may have a hardness of about 20 to about 90, based on the shore D hardness scale. The third layer 830 may include a fourth area 831 included in the first section ①, a fifth area 832 included in the second section ②, and a sixth area 833 included in the folding section ③. The thickness of the sixth area 833 may be formed to reduce a decrease in flexibility of the folding section ③, based on a material (or a mechanical property, such as hardness, based on the material) of the third layer 830. According to an embodiment, the third layer 830 may have elasticity to be restored substantially without predetermined deformation when the front cover 200 is changed from the folded state (not shown) to the unfolded state of FIG. 8.

According to an embodiment, the fourth layer 840 may be positioned between the fourth area 831 of the third layer 830 and the second layer 820. The fifth layer 850 may be positioned between the fifth area 832 of the third layer 830 and the second layer 830. The sixth area 833 may extend between the fourth layer 840 and the fifth layer 850. At least a portion of the sixth area 833 may have a thickness greater than the thickness T5 of the fourth area 831 and the thickness T6 of the fifth area 832. According to an embodiment, the sixth area 833 may include a pattern 834 formed on a bonding surface 832c with the second layer 820, and the pattern 834 may include a plurality of grooves or bumps. According to an embodiment, the pattern 834 may be positioned between the fourth layer 840 and the fifth layer 850. The pattern 834 including the plurality of grooves may reduce a decrease in flexibility of the folding section ③ due to the third layer 830 bonded to the first layer 810. For example, when the bonding surface 832c is formed without bumps as indicated by a reference numeral '832d', the thickness T7 of the sixth area 833 may reduce the flexibility of the folding section ③. According to an embodiment, the bonding surface 832c may include the pattern 834 of the plurality of grooves in a concave shape toward the first layer 810, thus reducing a decrease in flexibility of the folding section ③ due to the third layer 830 bonded to the first layer 810.

According to an embodiment, the plurality of grooves included in the pattern 834 may have a triangular cross-section. According to various embodiments, the number or cross-sectional shape of the plurality of grooves included in the pattern 834 may vary without being limited to the embodiment of FIG. 8. For example, the cross-sectional shape of the plurality of grooves included in the pattern 834 may correspond to the cross-sectional shape of the plurality of grooves included in the pattern 733*a* according to the embodiment of FIG. 7A, or the cross-sectional shape of the plurality of grooves included in the pattern 733*b* according to the embodiment of FIG. 7B. A gap between the plurality of grooves included in the pattern 834 may be constant, or may not be constant in an embodiment.

According to an embodiment, the fourth layer 840 and/or the fifth layer 850 may include glass. The thickness of the fourth layer 840 (e.g., the height between the second layer 820 and the third layer 830) may be substantially constant. The thickness of the fifth layer 850 (e.g., the height between the second layer 820 and the third layer 830) may be substantially constant. According to an embodiment, the thickness of the fourth layer 840 and the thickness of the fifth layer 850 may be substantially the same. According to an embodiment, the fourth layer 840 and/or the fifth layer 850 may have a greater thickness than that of the first layer 810. For example, the fourth layer 840 and/or the fifth layer 850 may have a greater thickness than that of the first layer 810, and may be formed to have a thickness of about 50 μm to about 500 μm. The fourth layer 840 is a portion that is not bendable without substantially being damaged, and may provide rigidity to the first section ①. The fifth layer 850 is a portion that is not bendable without being substantially damaged, and may provide rigidity to the second section ②.

According to an embodiment, the second layer 820 may cover the sixth area 833 of the third layer 830, the fourth layer 840, and the fifth layer 850 to form the smooth rear surface 202 for bonding with the flexible display 140. The second layer 820 may have hardness or ductility to reduce a decrease in flexibility of the folding section ③ due to the second layer 820. For example, the second layer 820 may have lower hardness than the third layer 830. According to an embodiment, the second layer 820 may have a hardness of about 20 or less, based on the shore D hardness scale. For example, the second layer 820 may have higher ductility than the third layer 830. According to an embodiment, the second layer 820 may have an elongation rate of about 4% to about 20%. When the front cover 200 is changed from the folded state (not shown) to the unfolded state of FIG. 8, the second layer 820 may be at least partially affected by the elasticity (or restoring force) of the third layer 830, thus being restored substantially without predetermined deformation.

According to an embodiment, the second layer 820 or the third layer 830 may include an acryl-based, urethane-based, or silicone-based organic material.

According to an embodiment, in the folded state of FIG. 3, the first section ① and the second section ② may be substantially parallel, or may form a narrow angle (e.g., an angle of about 0 degrees to about 10 degrees). In the folded state of FIG. 3, the third section ③ may be bent with a corresponding radius of curvature. The radius of curvature may be provided to prevent the front cover 200 and the flexible display 140 from being damaged due to internal stress caused by bending while achieving slimness of the electronic device 10 in the folded state (see FIG. 3) (e g, minimizing the separation distance between the first section ① and the second section ②).

According to various embodiments, the fourth area 831 may include a first rib 815 adjacently connected to the sixth area 833. The first rib 815 may include a first slope 815*a* connecting surfaces (not shown) having different heights due to a thickness difference between the fourth area 831 and the sixth area 833. The fifth area 832 may include a second rib 816 adjacently connected to the sixth area 833. The second rib 816 may include a second slope 816*a* connecting surfaces (not shown) having different heights due to a thickness difference between the fifth area 832 and the sixth area 833. The first slope 815*a* and/or the second slope 816*a* may be formed to have a curved surface. The first rib 815 may prevent stress from being concentrated on a connecting portion between the fourth area 831 and the sixth area 833 when the folding section ③ is bent. The first rib 815 may provide resistance for the connecting portion between the fourth area 831 and the sixth area 833 to be able to withstand impact when the folding section ③ is bent. The second rib 816 may prevent stress from being concentrated on a connecting portion between the fifth area 832 and the sixth area 833 when the folding section ③ is bent. The second rib 816 may provide resistance for the connecting portion between the fifth area 832 and the sixth area 833 to be able to withstand impact when the folding section ③ is bent.

According to an embodiment, the third layer 830 may include a material for increasing an interfacial bonding force (or bonding strength) with the first layer 810. The third layer 830 may include a material for increasing an interfacial bonding force with the second layer 820. The third layer 830 may include a material for increasing an interfacial bonding force with the fourth layer 840. The third layer 830 may include a material for increasing an interfacial bonding force with the fifth layer 850. According to an embodiment, the third layer 830 may include a material which may be strongly bonded to all of the first layer 810, the second layer 820, the fourth layer 840, and the fifth layer 850.

According to an embodiment, a material of the first layer 810, the second layer 820, the third layer 830, the fourth layer 840, or the fifth layer 850 may be selected to minimize a difference in refractive index between media (e.g., the layers) included in the front cover 200. When a difference in refractive index between the first layer 810 and the third layer 830, a difference in refractive index between the third layer 830 and the fourth layer 840, a difference in refractive index between the third layer 830 and the fifth layer 850, a difference in refractive index between the second layer 820 and the third layer 830, a difference in refractive index between the second layer 820 and the fourth layer 840, and a difference in refractive index between the second layer 820 and the fifth layer 850 are minimized, reflection on an interface and light loss due to the reflection may be reduced, and thus a clear image may be displayed on the screen. According to an embodiment, the difference in refractive index between the media may be about 0.01 or less, which is a level enabling a clear image to be secured.

According to an embodiment, the first layer 810 and the third layer 830 may be bonded substantially without an air gap. The third layer 830 and the fourth layer 840 may be bonded substantially without an air gap. The third layer 830 and the fifth layer 850 may be bonded substantially without an air gap. The second layer 820 and the third layer 830 may be bonded substantially without an air gap. The second layer 820 and the fourth layer 840 may be bonded substantially without an air gap. The second layer 820 and the fifth layer 850 may be bonded substantially without an air gap. Thus, loss of light output from the flexible display 140 may be reduced, thereby securing image quality.

Figure 9:
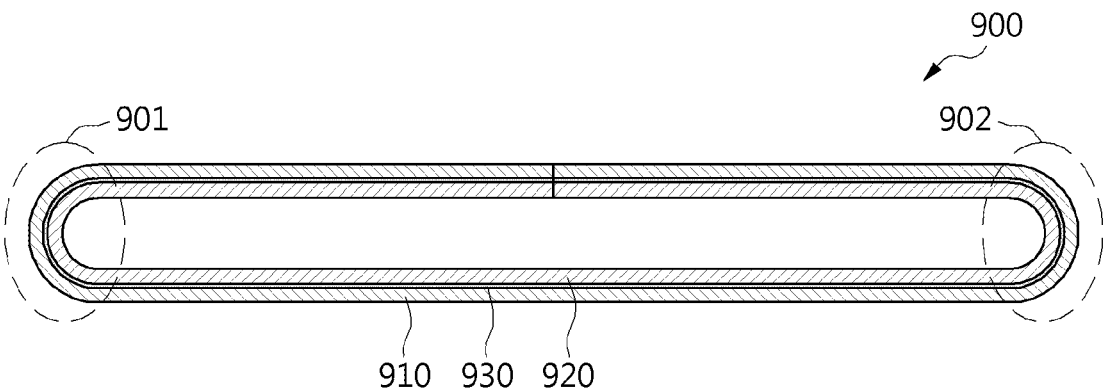
FIG. 9 is a cross-sectional view of an example display assembly in the folded state according to various embodiments.

FIG. 9 is a cross-sectional view of an example display assembly 900 in the folded state according to various embodiments.

Referring to FIG. 9, in an embodiment, the display assembly 900 may include a flexible display 910, a cover 920, or an optical transparent bonding member 930 (e.g., OCA, OCA, OCR, or SVR) between the flexible display 910 and the cover 920. For example, the display assembly 900 may include both folding parts 901 and 902. According to an embodiment, the cover 920 may be configured to include two folding sections (e.g., the folding section ③ of FIG. 5) and a layer-stacking structure according to the embodiment of FIG. 5, based on the cover 200 according to the embodiment of FIG. 5. According to another embodiment, the cover 920 may be configured to include two folding sections (e.g., the folding section ③ of FIG. 8) and a layer-stacking structure according to the embodiment of FIG. 8, based on the cover 200 according to the embodiment of FIG. 8.

Figure 10:
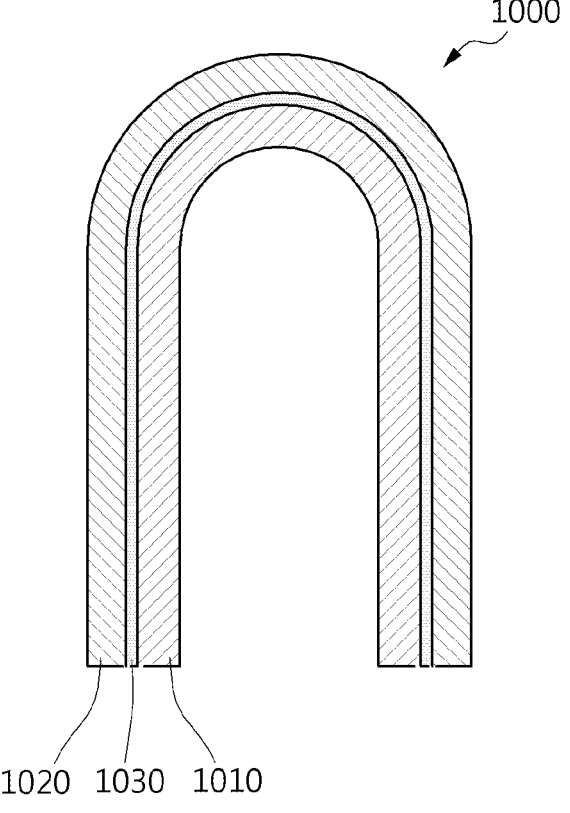
FIG. 10 is a cross-sectional view of an example display assembly in the folded state according to various embodiments.

FIG. 10 is a cross-sectional view of an example display assembly 1000 in the folded state according to various embodiments.

Referring to FIG. 10, in an embodiment, the display assembly 1000 may include a flexible display 1010, a cover 1020, or an optical transparent bonding member 1030 (e.g., OCA, OCA, OCR, or SVR) between the flexible display 1010 and the cover 1020. For example, the display assembly 1000 may be configured in an out-folding structure in which a screen is folded outward. According to an embodiment, the cover 1020 may be configured based on the cover 200 according to the embodiment of FIG. 5 or the embodiment of FIG. 8.

According to an embodiment of the disclosure, an electronic device (e.g., the electronic device 10 of FIG. 1) may include a transparent cover (e.g., the front cover 200 of FIG. 1) and a flexible display (e.g., the flexible display 140 of FIG. 1) coupled to the cover. The cover may include a first layer (e.g., the first layer 510 of FIG. 5 or the first layer 810 of FIG. 8) including glass, a second layer (e.g., the second layer 520 of FIG. 5, or the second layer 820 of FIG. 8) positioned between the first layer and the flexible display, and a third layer (e.g., the third layer 530 of FIG. 5 or the third layer 830 of FIG. 8) positioned between the first layer and the second layer. The third layer may include a pattern (e.g., the pattern 533 of FIG. 5 or the pattern 834 of FIG. 8) overlapping a folding part (e.g., the folding part 143 of FIG. 5 or 8) of the flexible display and including a plurality of grooves formed on a bonding surface (e.g., the bonding surface 532c of FIG. 5 or the bonding surface 832c of FIG. 8) with the second layer. The third layer may have a hardness greater than that of the second layer.

According to an embodiment of the disclosure, the flexible display (e.g., the flexible display 140 of FIG. 5 or 8) may include a first part (e.g., the first part 141 of FIG. 5 or 8) and a second part (e.g., the second part 142 of FIG. 5 or 8) positioned with the folding part (e.g., the folding part 143 of FIG. 5 or 8) therebetween. The cover (e.g., the front cover 200 of FIG. 5 or 8) may include a folding section (e.g., a folding section ③ of FIG. 5 or 8) overlapping the folding part, a first section (e.g., a first section ① of FIG. 5 or 8) overlapping the first part, and a second section (e.g., a second section ② of FIG. 5 or 8) overlapping the second part. The cover may have the same thickness in the first section, the second section, and the folding section.

According to an embodiment of the disclosure, the first layer (e.g., the first layer 510 of FIG. 5) may have a smaller thickness in the folding section (e.g., the folding section ③ of FIG. 5) than that in the first section (e.g., the first section ① of FIG. 5) and the second section (e.g., the second section ② of FIG. 5).

According to an embodiment of the disclosure, the first layer (e.g., the first layer 510 of FIG. 5) may include a recess (e.g., the recess 514 of FIG. 5) formed in the folding section (e.g., the folding section ③ of FIG. 5) to face the pattern (e.g., the pattern 533 of FIG. 5).

According to an embodiment of the disclosure, the first layer (e.g., the first layer 510 of FIG. 5) may have a thickness of 10 μm to 100 μm in the folding section (e.g., the folding section ③ of FIG. 5).

According to an embodiment of the disclosure, the first layer (e.g., the first layer 510 of FIG. 5) may have a thickness of 100 μm to 1000 μm in the first section (e.g., the first section ① of FIG. 5) or the second section (e.g., the second section ② of FIG. 5).

According to an embodiment of the disclosure, the first layer (e.g., the first layer 510 of FIG. 5) may include a slope (e.g., the first slope 515a or the second slope 516b of FIG. 5) connecting an area of a first thickness included in the first section (e.g., the first section ① of FIG. 5) or the second section (e.g., the second section ② of FIG. 5) and an area of a second thickness smaller than the first thickness included in the folding section (e.g., the folding section ③ of FIG. 5).

According to an embodiment of the disclosure, a difference in refractive index between the first layer (e.g., the first layer 510 of FIG. 5) and the third layer (e.g., the third layer 530 of FIG. 5) and/or a difference in refractive index between the second layer (e.g., the second layer 520 of FIG. 5) and the third layer (e.g., the third layer 530 of FIG. 5) may be 0.01 or less.

According to an embodiment of the disclosure, the first section (e.g., the first section ① of FIG. 8) may further include a fourth layer (e.g., the fourth layer 840 of FIG. 8) positioned between the first layer (e.g., the first layer 810 of FIG. 8) and the second layer (e.g., the second layer 820 of FIG. 8) and including glass. The second section (e.g., the second section ② of FIG. 8) may further include a fifth layer (e.g., the fifth layer 850 of FIG. 8) positioned between the first layer and the second layer and including glass. The third layer (e.g., the third layer 830 of FIG. 8) may extend between the first layer and the fourth layer and between the first layer and the fifth layer.

According to an embodiment of the disclosure, the pattern (e.g., the pattern 834 of FIG. 8) may be positioned between the fourth layer (e.g., the fourth layer 840 of FIG. 8) and the fifth layer (e.g., the fifth layer 850 of FIG. 8).

According to an embodiment of the disclosure, the first layer (e.g., the first layer 810 of FIG. 8) may have the same thickness in the first section (e.g., the first section ① of FIG. 8), the second section (e.g., the second section ② of FIG. 8), and the folding section (e.g., the folding section ③ of FIG. 8).

According to an embodiment of the disclosure, the fourth layer (e.g., the fourth layer 840 of FIG. 8) and/or the fifth layer (e.g., the fifth layer 850 of FIG. 8) may have a greater thickness than that of the first layer (e.g., the first layer 810 of FIG. 8).

According to an embodiment of the disclosure, the first layer (e.g., the first layer 810 of FIG. 8) may have a thickness of 10 μm to 100 μm.

According to an embodiment of the disclosure, a difference in refractive index between the first layer (e.g., the first layer 810 of FIG. 8) and the third layer (e.g., the third layer 830 of FIG. 8), a difference in refractive index between the second layer (e.g., the second layer 820 of FIG. 8) and the third layer, a difference in refractive index between the second layer and the fourth layer (e.g., the fourth layer 840 of FIG. 8), a difference in refractive index between the second layer and the fifth layer (e.g., the fifth layer 850 of FIG. 8), a difference in refractive index between the third layer and the fourth layer, and/or a difference in refractive index between the third layer and the fifth layer may be 0.01 or less.

According to an embodiment of the disclosure, the first section (e.g., the first section ① of FIG. 6) and the second section (e.g., the second section ② of FIG. 6) may face each other and may be positioned between the first part (e.g., the first part 141 of FIG. 6) and the second part (e.g., the second part 142 of FIG. 6) in a folded state of the electronic device. According to another embodiment of the disclosure, the first section and the second section may be positioned between the first part and the second part, which are positioned opposite to each other, in a folded state of the electronic device (see FIG. 10).

According to an embodiment of the disclosure, the third layer (e.g., the third layer 530 of FIG. 5 or the third layer 830 of FIG. 8) may have a hardness of 20 to 90, based on a shore D hardness scale.

According to an embodiment of the disclosure, the second layer (e.g., the second layer 520 of FIG. 5 or the second layer 820 of FIG. 8) may have an elongation rate of about 4% to about 20%.

According to an embodiment of the disclosure, the second layer (e.g., the second layer 520 of FIG. 5 or the second layer 820 of FIG. 8) or the third layer (e.g., the third layer 530 of FIG. 5 or the third layer 830 of FIG. 8) may include an acryl-based, urethane-based, or silicone-based organic material.

According to an embodiment of the disclosure, the electronic device (e.g., the electronic device 10 of FIG. 1) may further include an electromagnetic induction panel configured to be coupled to or disposed adjacent to the flexible display (e.g., the flexible display 140 of FIG. 5 or FIG. 8), and to detect a pen input device (e.g., the pen input device 175 of FIG. 5 or FIG. 8).

The embodiments of the disclosure described and shown in the specification and the drawings are merely specific examples that have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea of the disclosure.

What is claimed is:

1. An electronic device comprising:
a transparent cover that comprises a first section, a second section, and a folding section between the first section and the second section; and
a flexible display coupled to the transparent cover,
wherein the transparent cover comprises:
a first layer comprising glass; and included in the first, second, and folding sections,
a second layer between the first layer and the flexible display and included in the first, second, and folding sections,
a third layer between the first layer and the second layer and included in the first, second, and folding sections,
a fourth layer between a portion of the third layer and a portion of the second layer at the first section and comprising glass, and
a fifth layer between a portion of the third layer and a portion of the second layer at the second section and comprising glass,
wherein the first layer has a same thickness in the first section, the second section, and the folding section,
wherein the third layer comprises a pattern including a plurality of grooves formed on a bonding surface with the second layer at the folding section, and has a hardness greater than a hardness of the second layer, and
wherein the pattern of the third layer is between the fourth layer and the fifth layer.

2. The electronic device of claim 1, wherein at least one of the fourth layer or the fifth layer has a greater thickness than the thickness of the first layer.

3. The electronic device of claim 1, wherein the first layer has a thickness of 10 μm to 100 μm.

4. The electronic device of claim 1, wherein a difference in refractive index between the first layer and the third layer, a difference in refractive index between the second layer and the third layer, a difference in refractive index between the second layer and the fourth layer, a difference in refractive index between the second layer and the fifth layer, a difference in refractive index between the third layer and the fourth layer, and/or a difference in refractive index between the third layer and the fifth layer is 0.01 or less.

5. The electronic device of claim 1, wherein the first section and the second section face each other in a folded state of the electronic device.

6. The electronic device of claim 1, wherein the first section and the second section are positioned opposite to each other, in a folded state of the electronic device.

7. The electronic device of claim 1, wherein the third layer has a hardness of 20 to 90, based on a shore D hardness scale.

8. The electronic device of claim 1, wherein the second layer has an elongation rate of about 4% to about 20%.

9. The electronic device of claim 1, wherein the second layer or the third layer comprises an acryl-based, urethane-based, or silicone-based organic material.

10. The electronic device of claim 1, further comprising an electromagnetic induction panel configured to be coupled to or disposed adjacent to the flexible display, and to detect a pen input device.

* * * * *